(12) United States Patent
Nishiguchi

(10) Patent No.: US 11,264,584 B2
(45) Date of Patent: Mar. 1, 2022

(54) DISPLAY DEVICE AND METHOD FOR MANUFACTURING SAME

(71) Applicant: SHARP KABUSHIKI KAISHA, Sakai (JP)

(72) Inventor: Masao Nishiguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 22 days.

(21) Appl. No.: 17/044,260

(22) PCT Filed: Apr. 10, 2018

(86) PCT No.: PCT/JP2018/015143
§ 371 (c)(1),
(2) Date: Sep. 30, 2020

(87) PCT Pub. No.: WO2019/198164
PCT Pub. Date: Oct. 17, 2019

(65) Prior Publication Data
US 2021/0020862 A1    Jan. 21, 2021

(51) Int. Cl.
*H01L 51/52*    (2006.01)
*H01L 51/50*    (2006.01)
*H01L 27/32*    (2006.01)
*H01L 27/12*    (2006.01)

(52) U.S. Cl.
CPC ...... *H01L 51/5056* (2013.01); *H01L 27/3218* (2013.01); *H01L 51/5004* (2013.01); *H01L 51/5218* (2013.01); *H01L 27/1222* (2013.01)

(58) Field of Classification Search
CPC combination set(s) only.
See application file for complete search history.

(56) References Cited

U.S. PATENT DOCUMENTS

2014/0284566 A1    9/2014  Yoo et al.
2021/0225969 A1*   7/2021  Kim .................... H01L 51/5056

FOREIGN PATENT DOCUMENTS

JP    2014-187020 A    10/2014
JP    2016-195181 A    11/2016

* cited by examiner

*Primary Examiner* — Suberr L Chi
(74) *Attorney, Agent, or Firm* — ScienBiziP, P.C.

(57) ABSTRACT

A film thickness securing region of a green island-shaped hole transport layer in a display device is located at the inside of a green pixel light-emitting region in a direction in which a red pixel and a green pixel are adjacent to each other, and part of a shadow region of a red island-shaped hole transport layer and part of a shadow region of the green island-shaped hole transport layer overlaps each other within the green pixel light-emitting region.

19 Claims, 17 Drawing Sheets

DISPLAY DEVICE AND METHOD FOR MANUFACTURING SAME

TECHNICAL FIELD

The disclosure relates to a display device having a microcavity structure and to a manufacturing method for the same.

BACKGROUND ART

As a display device configured to display color images, well-known is a display device in which color pixels provided with light-emitting elements for emitting light of colors of red (R), green (G), and blue (B) are regularly arrayed, for example.

In recent years, a method in which a resonance structure referred to as a microcavity (microresonator) structure is introduced in a light-emitting element, has been proposed as a method for improving chromaticity and luminous efficiency of light that is emitted from each pixel in the above-mentioned display device.

The microcavity is a phenomenon where light emitted in a light-emitting layer is multiply reflected between an anode electrode and a cathode electrode to achieve resonance, thereby making the light emission spectrum steep and amplifying the light emission intensity of a specific wavelength. Examples of the method in which the microcavity structure is introduced in the light-emitting element include a method of changing an optical path length (resonance distance) of the light-emitting element for each luminescent color.

For example, in PTL 1, an island-shaped first resonant auxiliary layer and an island-shaped second resonant auxiliary layer each made of a hole transport material are formed corresponding to a red pixel and a green pixel on a hole injection layer provided common to each of the red, green, and blue pixels via a blue light-emitting layer provided therebetween common to each of the pixels. The first resonant auxiliary layer formed in the red pixel and the second resonant auxiliary layer formed in the green pixel, as discussed above, each functions as a hole transport layer. In PTL 1, in order to adjust the resonance distances of the red light and the green light, the thickness of the first resonant auxiliary layer is greater than the thickness of the second resonant auxiliary layer.

In PTL 2, a common hole transport layer and a common blue light-emitting layer are layered adjacent to each other to be shared by red, green, and blue pixels, while an island-shaped hole transport layer is provided for each pixel. In PTL 2, the island-shaped hole transport layer, the common hole transport layer, and the common blue light-emitting layer are layered in that order for the blue pixel, and the island-shaped hole transport layer, an island-shaped light-emitting layer (a green light-emitting layer or a red light-emitting layer), the common hole transport layer, and the common blue light-emitting layer are layered in that order for the red pixel and the green pixel. It is disclosed in PTL 2 to optimize the film thickness of the island-shaped hole transport layer for each pixel by forming the island-shaped hole transport layers having different film thicknesses between the blue pixel and the red and green pixels.

CITATION LIST

Patent Literature

PTL 1: JP 2014-187020 A (published on Oct. 2, 2014)
PTL 2: JP 2016-195181 A (published on Nov. 17, 2016)

SUMMARY

Technical Problem

As described above, the island-shaped hole transport layer formed for each pixel can be formed by, for example, a vacuum vapor deposition technique using a vapor deposition mask provided with high accuracy mask openings, which is referred to as a fine metal mask (FMM).

However, a vapor deposition material used for vacuum vapor deposition is deposited not only on a front face of a film formed substrate, but also on a front face of the vapor deposition mask. Therefore, when a hole transport material is used as the vapor deposition material, after the hole transport layer is formed as a vapor deposition film on the film formed substrate, a film made of the hole transport material that has not reached the film formed substrate may remain as a film formation residual on the front face of the vapor deposition mask.

The film thickness of such film formation residual is increased every time the film formation is repeated. When the film thickness of the film formation residual is increased, the film formation residual is easily peeled off from the vapor deposition mask. The film formation residual that has been peeled off is, for example, reheated at a vapor deposition source to become a gas, which adheres to the film formed substrate, thereby degrading the quality of the vapor deposition film to be film-formed on the film formed substrate, causing a failure, or the like. Additionally, the vapor deposition material deposited on the vapor deposition mask may affect a pattern accuracy of the vapor deposition film to be formed on the film formed substrate.

Therefore, such film formation residual needs to be removed by periodically washing the vapor deposition mask in order to prevent a bad influence being exerted on the pattern of the vapor deposition film to be film-formed on the film formed substrate. The higher the definition of the pattern of the vapor deposition film (film formation pattern) that is film-formed on the film formed substrate, the shorter the washing cycle is.

Further, the greater the thickness of the vapor deposition film to be film-formed, the more the amount of the film formation residual that adheres to the vapor deposition mask in a single vapor deposition is increased. Thus, as described above, in the case where the microcavity structure is introduced in the light-emitting element, the washing cycle of the vapor deposition mask used for film formation of the island-shaped hole transport layer that is formed in the red pixel becomes shorter than the washing cycle of the vapor deposition mask used for film formation of the island-shaped hole transport layer that is formed in the pixel of any of the other colors.

Therefore, as the film pattern becomes higher in definition, the washing cycle of the vapor deposition mask used for film formation of the island-shaped hole transport layer in the red pixels, for example, becomes particularly short, thereby causing a reduction in productivity of the device.

The disclosure has been conceived in light of the above problem, and an object thereof is to provide a high-resolution display device and a manufacturing method for the same, which are able to extend a washing cycle of a vapor deposition mask used in the manufacture as compared to the known washing cycle, and also able to improve the productivity as compared to the known art.

Solution to Problem

In order to solve the above problem, a display device according to one aspect of the disclosure is a display device provided with a plurality of pixels including a first pixel configured to emit first light with a peak wavelength being the longest wavelength, and a second pixel being adjacent to the first pixel and configured to emit second light with a peak wavelength being a shorter wavelength than the first light, the display device including: a common hole transport layer in a solid-like state provided to be shared by each pixel; island-shaped hole transport layers layered adjacent to the common hole transport layer and provided in an island shape for each of the plurality of pixels; light-emitting layers layered adjacent to each of the island-shaped hole transport layers and provided in an island shape for each of the plurality of pixels; and a pixel separation wall disposed between adjacent pixels. In the stated display device, an opening of the pixel separation wall is a light-emitting region of each pixel; each of the island-shaped hole transport layers includes a film thickness securing region having a constant film thickness, and a shadow region provided on a peripheral portion of the film thickness securing region and having a film thickness that is gradually thinned; the film thickness securing region of a first island-shaped hole transport layer, among the island-shaped hole transport layers, provided corresponding to the first pixel is provided across the light-emitting region of the first pixel in a direction in which the first pixel and the second pixel are adjacent to each other; the film thickness securing region of a second island-shaped hole transport layer, among the island-shaped hole transport layers, provided corresponding to the second pixel is located inside the light-emitting region of the second pixel in the direction described above; and part of the shadow region of the first island-shaped hole transport layer and part of the shadow region of the second island-shaped hole transport layer overlap with each other inside the light-emitting region of the second pixel.

In order to solve the above problem, a manufacturing method for a display device according to one aspect of the disclosure is a manufacturing method for a display device provided with a plurality of pixels including a first pixel configured to emit first light with a peak wavelength being the longest wavelength, and a second pixel being adjacent to the first pixel and configured to emit second light with a peak wavelength being a shorter wavelength than the first light, the method including: (1) forming a pixel separation wall between adjacent pixels; and (2) forming a function layer in which included are forming a common hole transport layer in a solid-like state provided to be shared by each pixel, forming island-shaped hole transport layers layered adjacent to the common hole transport layer and provided in an island shape for each of the plurality of pixels, and forming light-emitting layers layered adjacent to each island-shaped hole transport layer and provided in an island shape for each of the plurality of pixels. Further, an opening of the pixel separation wall is a light-emitting region of each pixel. In the forming of the island-shaped hole transport layers, film thickness securing regions having a constant film thickness and shadow regions each provided on a peripheral portion of the film thickness securing region and having a film thickness that is gradually thinned are formed in the island-shaped hole transport layers; and a first island-shaped hole transport layer and a second island-shaped hole transport layer are formed in such a manner that a film thickness securing region of the first island-shaped hole transport layer, among the island-shaped hole transport layers, provided corresponding to the first pixel is provided across the light-emitting region of the first pixel in a direction in which the first pixel and the second pixel are adjacent to each other, a film thickness securing region of the second island-shaped hole transport layer, among the island-shaped hole transport layers, provided corresponding to the second pixel is located inside the light-emitting region of the second pixel in the direction described above, and part of a shadow region of the first island-shaped hole transport layer and part of a shadow region of the second island-shaped hole transport layer overlap each other at a portion within the light-emitting region of the second pixel.

Advantageous Effects of Disclosure

According to one aspect of the disclosure, it is possible to provide a high-resolution display device and a manufacturing method for the same, which are able to extend a washing cycle of a vapor deposition mask used in the manufacture as compared to the known art, and also able to improve the productivity as compared to the known art.

DESCRIPTION OF EMBODIMENTS

One embodiment of the disclosure will be described below based on FIGS. 1 to 22.

Schematic Configuration of Display Device

Figure 3:
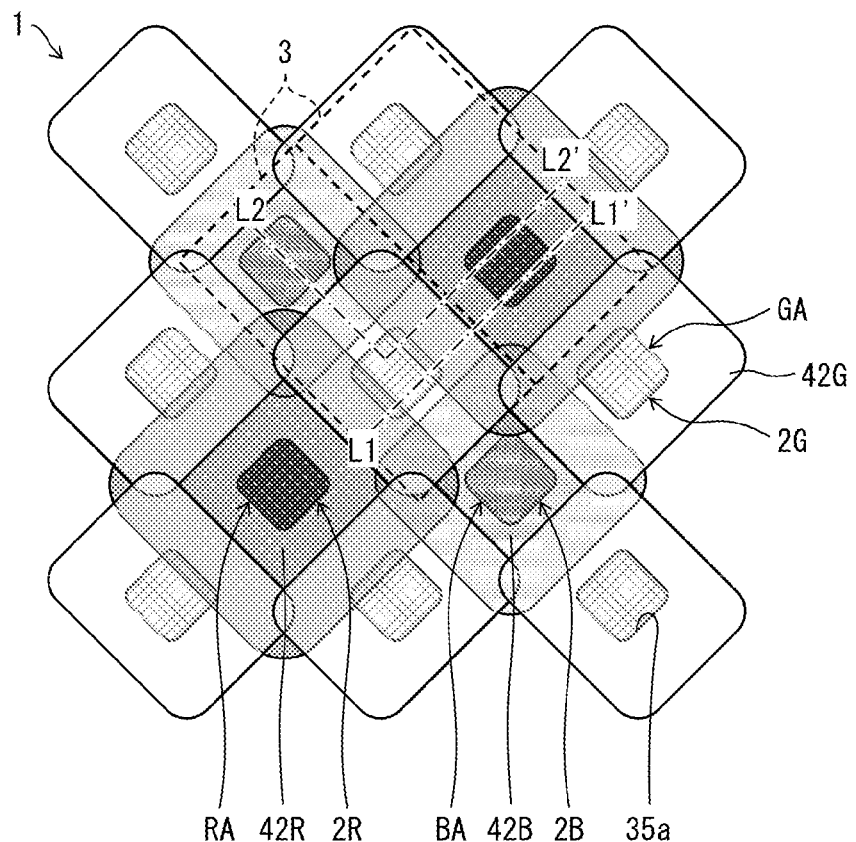
FIG. 3 is a plan view illustrating a schematic configuration of main portions of a display device according to an embodiment of the disclosure.

FIG. 3 is a plan view illustrating a schematic configuration of main portions of a display device 1 according to the present embodiment. Note that in FIG. 3, for convenience of illustration, the numbers of red pixels 2R, green pixels 2G, and blue pixels 2B are respectively lessened. For convenience of illustration, FIG. 3 illustrates only a red island-shaped hole transport layer 42R and a red pixel light-emitting region RA in the red pixel 2R, a green island-shaped hole transport layer 42G and a green pixel light-emitting region GA in the green pixel 2G, and a blue island-shaped hole transport layer 42B and a blue pixel light-emitting region BA in the blue pixel 2B.

Hereinafter, when there is no need to distinguish the red pixel 2R, the green pixel 2G, and the blue pixel 2B from one another, these are collectively referred to simply as the pixel 2. Likewise, when there is no need to distinguish the red island-shaped hole transport layer 42R, the green island-shaped hole transport layer 42G, and the blue island-shaped hole transport layer 42B from one another, these are collectively referred to simply as the island-shaped hole transport layer 42. Note that, hereinafter, the red pixel light-emitting region RA, the green pixel light-emitting region GA, and the blue pixel light-emitting region BA are each treated as the pixel 2 (effective pixel).

FIG. 3 illustrates, as an example of the display device 1 according to the present embodiment, a display device having pixel arrangement referred to as PenTile arrangement. In the display device 1 illustrated in FIG. 3, for example, pixel lines of odd columns and odd rows are each a monochromatic pixel line in which a plurality of green pixels 2G are provided being aligned in a straight line, while pixel lines of even columns and even rows are each a pixel line in which the red pixels 2R and the blue pixels 2B are alternately arranged.

Each of the pixels 2 has a quadrangular shape in which each side of each pixel 2 is inclined at an angle of 45 degrees with respect to a column direction and a row direction. The display device 1 includes, in a display region, a plurality of picture elements 3 each constituted of the green pixel 2G and blue pixel 2B or the red pixel 2R and green pixel 2G adjacent to each other in an oblique direction (third direction) intersecting with the row direction and the column direction at 45 degrees.

In the PenTile arrangement, each picture element 3 is constituted by a combination of the pixels 2 of two colors of RG or BG, and the pixel 2 of a lacking color in each picture element 3 is reproduced in a pseudo manner by combining the picture element 3 with an adjacent picture element 3 including the pixel 2 of the lacking color, thereby making it possible to reduce the number of pixels within one picture element 3. This makes it possible to maintain the apparent resolution high with a small number of pixels, and cause the opening size of the FMM to be larger than in a case where other types of pixel arrangement are used.

Figure 1:
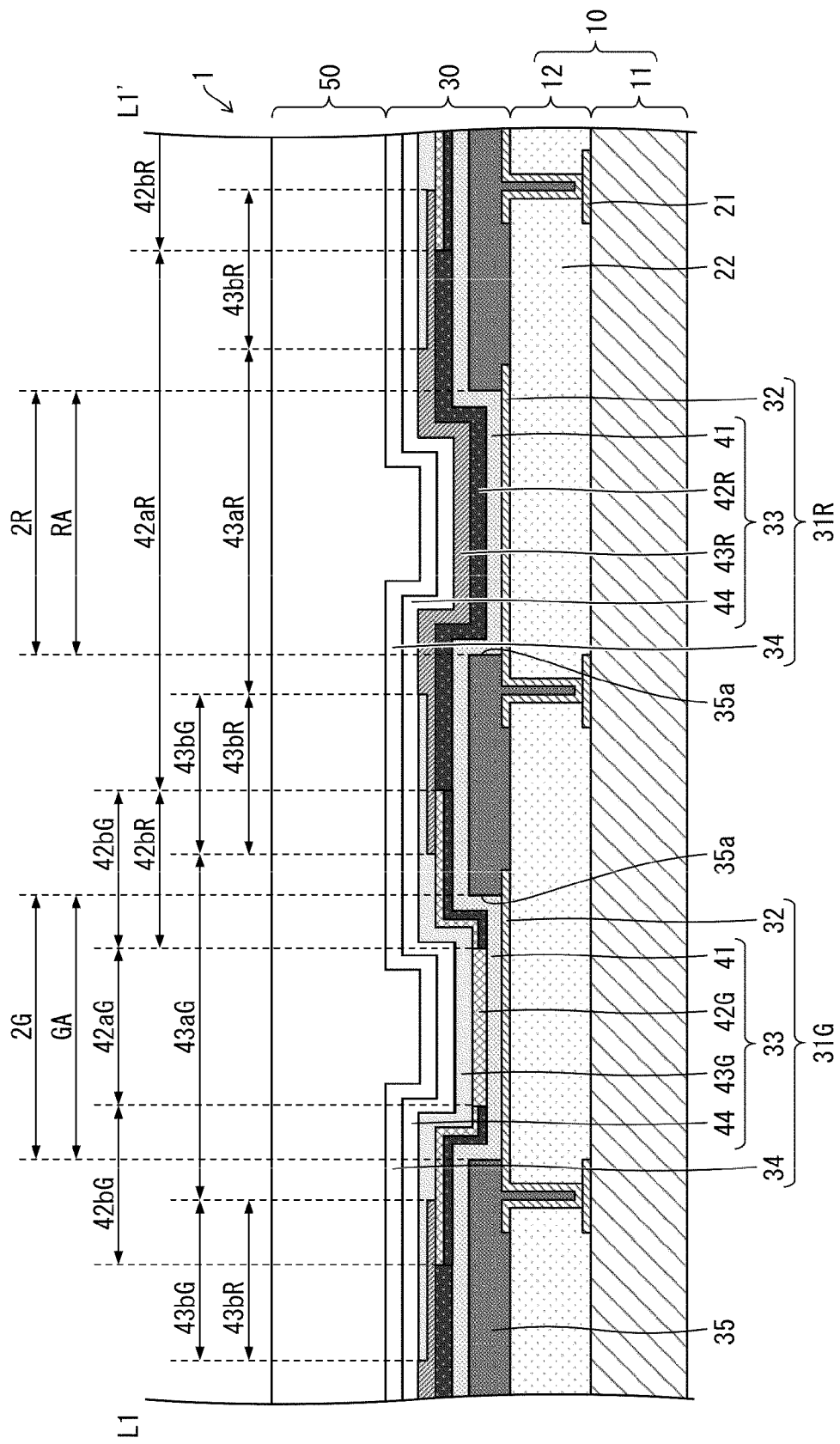
FIG. 1 is a cross-sectional view generally illustrating a schematic configuration of main portions of a display device according to an embodiment of the disclosure.
Figure 2:
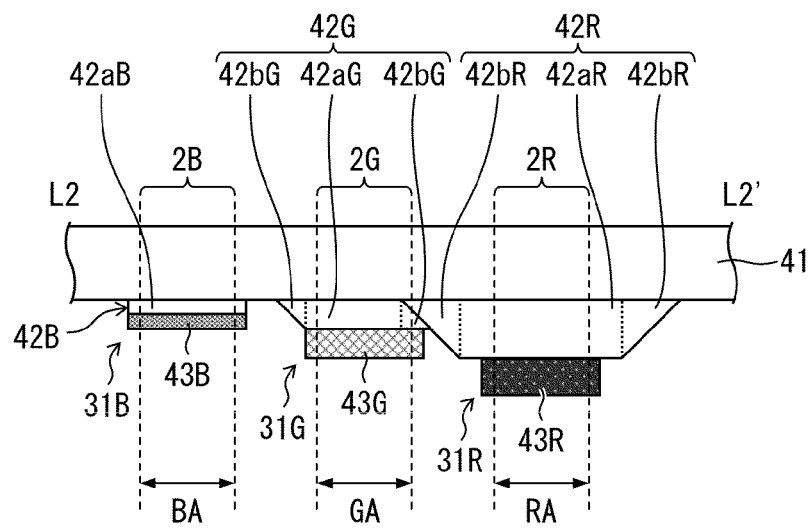
FIG. 2 is a cross-sectional view generally illustrating a relationship among a red island-shaped hole transport layer, a red light-emitting layer, a green island-shaped hole transport layer, and a green light-emitting layer in a display device according to an embodiment of the disclosure.
Figure 4:
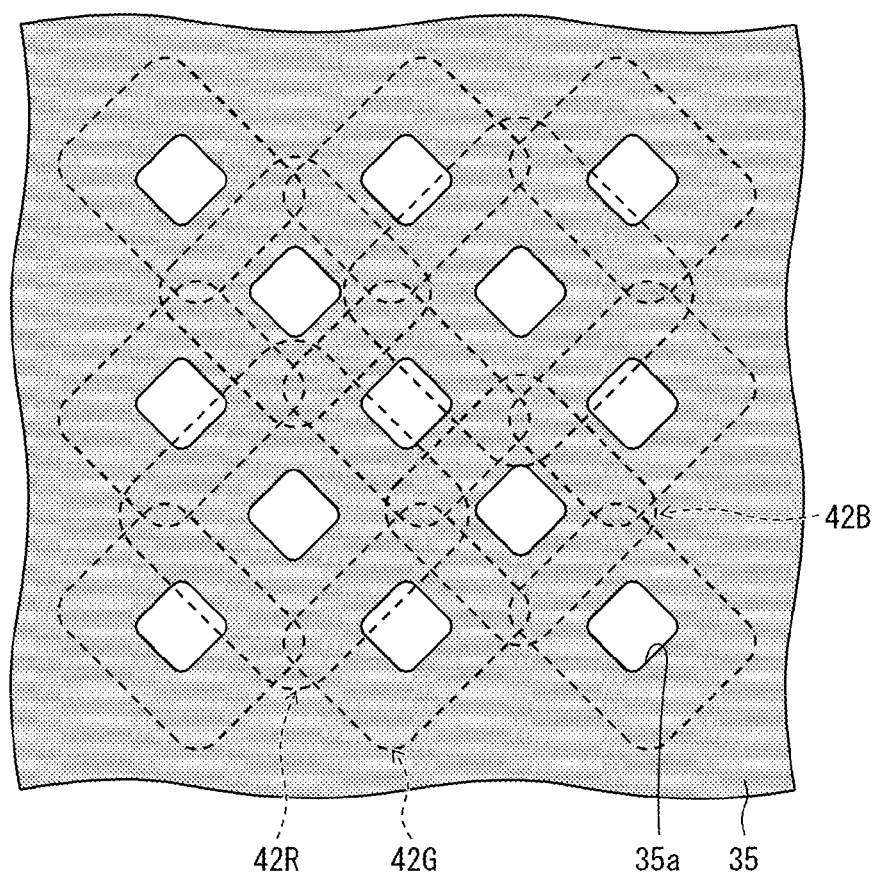
FIG. 4 is a plan view illustrating a schematic configuration of a bank in a display region of a display device according to an embodiment of the disclosure.
Figure 5:
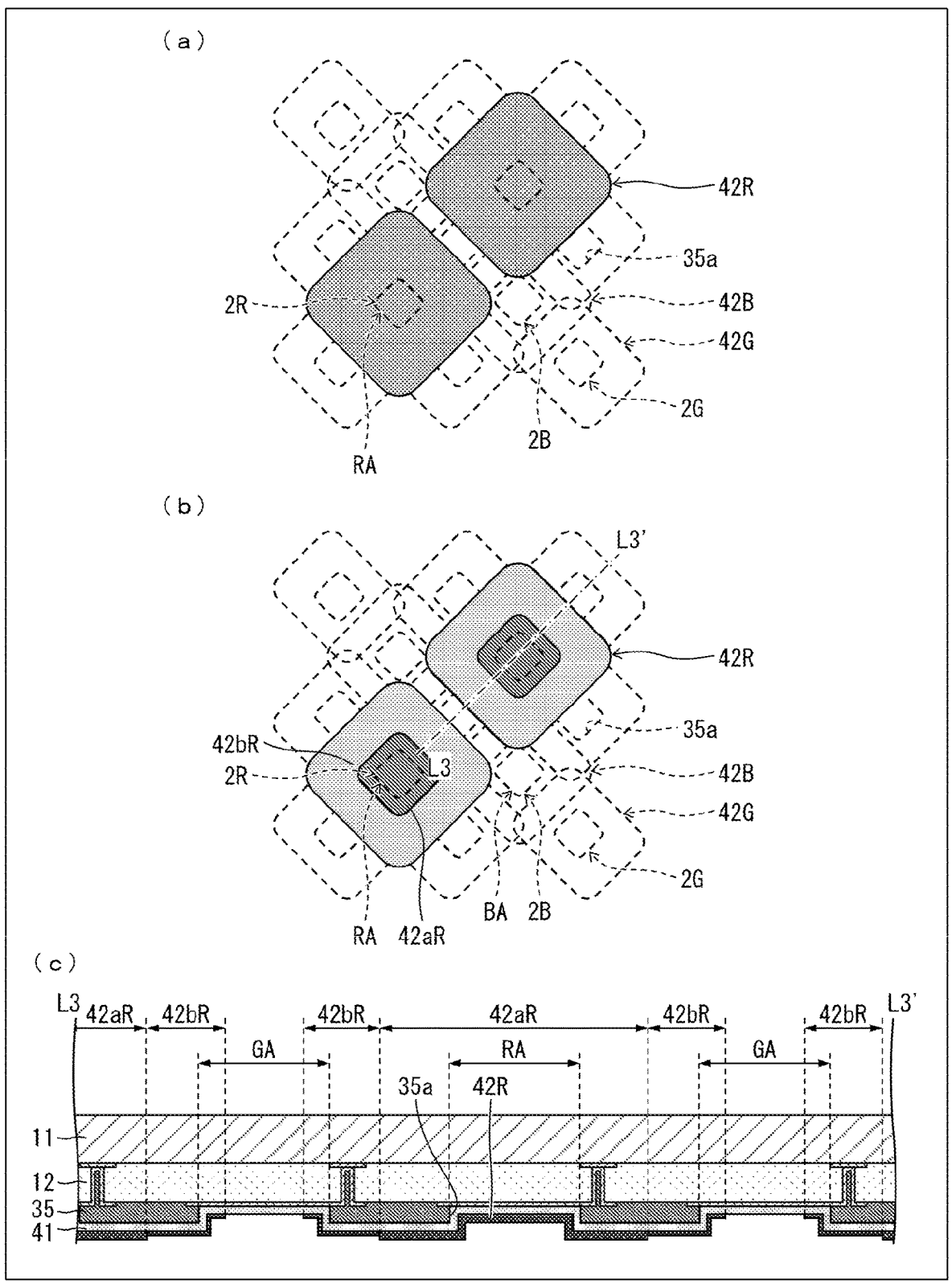
FIG. 5(a) is a plan view illustrating a red island-shaped hole transport layer of the display device illustrated in FIG. 3.
FIG. 5(b) is a plan view illustrating a film thickness securing region and a shadow region of the red island-shaped hole transport layer of the display device illustrated in FIG. 5(a)
FIG. 5(c) is a cross-sectional view illustrating a schematic configuration of the display device when the red island-shaped hole transport layer illustrated in FIG. 5(b) is formed.
Figure 6:
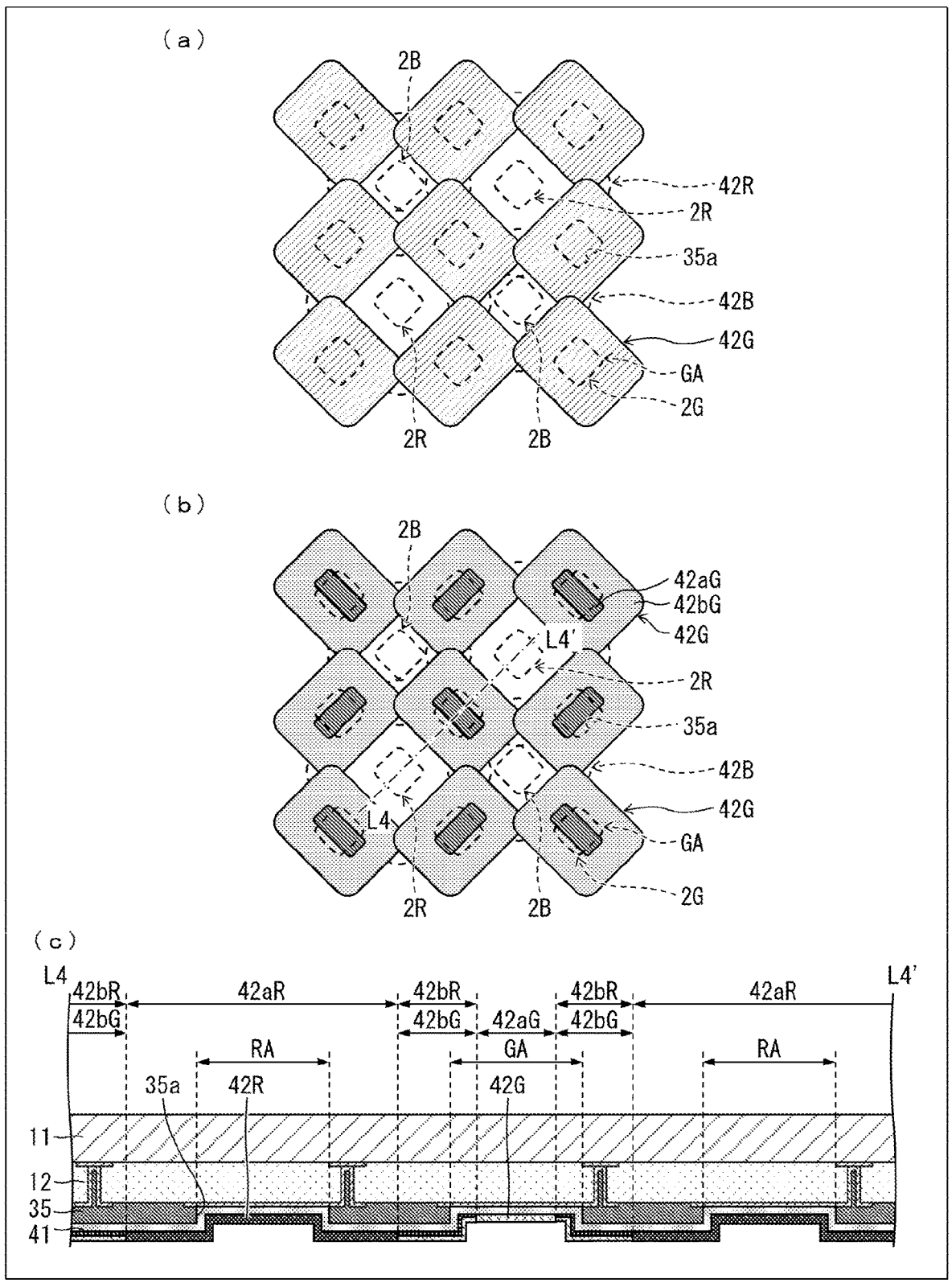
FIG. 6(a) is a plan view illustrating a green island-shaped hole transport layer of the display device illustrated in FIG. 3.
FIG. 6(b) is a plan view illustrating a film thickness securing region and a shadow region of the green island-shaped hole transport layer of the display device illustrated in FIG. 6(a)
FIG. 6(c) is a cross-sectional view illustrating a schematic configuration of the display device when the green island-shaped hole transport layer illustrated in FIG. 6(b) is formed.
Figure 7:
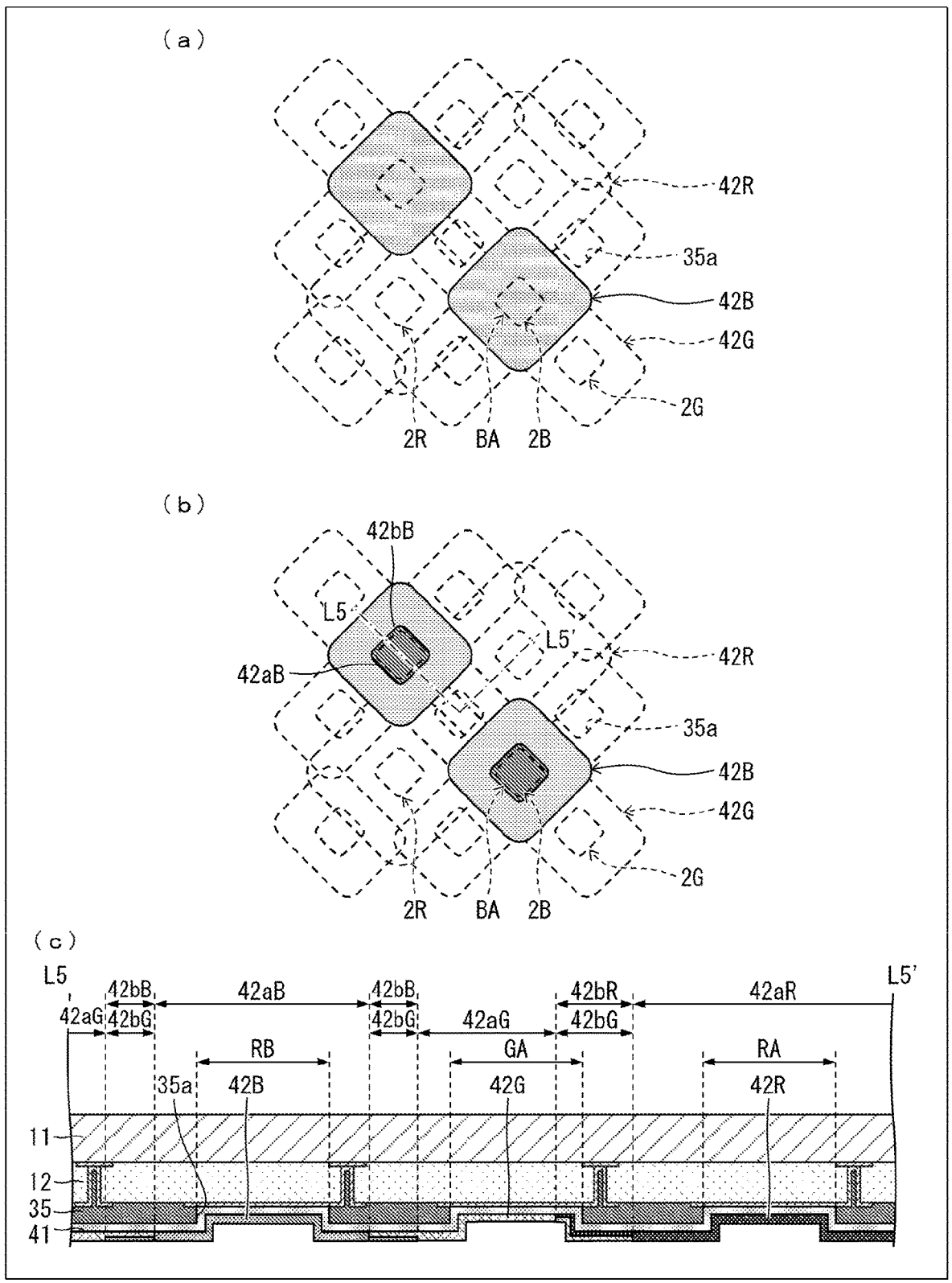
FIG. 7(a) is a plan view illustrating a blue island-shaped hole transport layer of the display device illustrated in FIG. 3.
FIG. 7(b) is a plan view illustrating a film thickness securing region and a shadow region of the blue island-shaped hole transport layer of the display device illustrated in FIG. 7(a)
FIG. 7(c) is a cross-sectional view illustrating a schematic configuration of the display device when the blue island-shaped hole transport layer illustrated in FIG. 7(b) is formed.

FIG. 1 is a cross-sectional view generally illustrating a schematic configuration of main portions of a display device 1 according to the present embodiment. FIG. 2 is a cross-sectional view generally illustrating a relationship among the red island-shaped hole transport layer 42R, a red light-emitting layer 43R, the green island-shaped hole transport layer 42G, and a green light-emitting layer 43G in the display device 1 according to the present embodiment. FIG. 4 is a plan view illustrating a schematic configuration of a bank 35 in the display region of the display device 1 according to the present embodiment. (a) of FIG. 5 is a plan view illustrating the red island-shaped hole transport layer 42R of the display device 1 illustrated in FIG. 3, (b) of FIG. 5 is a plan view illustrating a film thickness securing region 42aR and a shadow region 42bR of the red island-shaped hole transport layer 42R of the display device 1 illustrated in (a) of FIG. 5, and (c) of FIG. 5 is a cross-sectional view illustrating a schematic configuration of the display device 1 when the red island-shaped hole transport layer 42R illustrated in (b) of FIG. 5 is formed. (a) of FIG. 6 is a plan view illustrating the green island-shaped hole transport layer 42G of the display device 1 illustrated in FIG. 3, (b) of FIG. 6 is a plan view illustrating a film thickness securing region 42aG and a shadow region 42bG of the green island-shaped hole transport layer 42G of the display device 1 illustrated in (a) of FIG. 6, and (c) of FIG. 6 is a cross-sectional view illustrating a schematic configuration of the display device 1 when the green island-shaped hole transport layer 42G illustrated in (b) of FIG. 6 is formed. (a) of FIG. 7 is a plan view illustrating the blue island-shaped hole transport layer 42B of the display device 1 illustrated in FIG. 3, (b) of FIG. 7 is a plan view illustrating a film thickness securing region 42aB and a shadow region 42bB of the blue island-shaped hole transport layer 42B of the display device 1 illustrated in (a) of FIG. 7, and (c) of FIG. 7 is a cross-sectional view illustrating a schematic configuration of the display device 1 when the blue island-shaped hole transport layer 42B illustrated in (b) of FIG. 7 is formed.

Note that FIG. 1 illustrates a schematic configuration of the display device 1 at a cross section taken along a line L1-L1' indicated in FIG. 3. FIG. 2 illustrates a schematic configuration of the display device 1 at a cross section taken along a line L2-L2' indicated in FIG. 3. In (a) and (b) of FIG. 5, only the red island-shaped hole transport layer 42R illustrated in FIG. 3 is shaded and indicated by a solid line, while the green island-shaped hole transport layer 42G and the blue island-shaped hole transport layer 42B illustrated in FIG. 3 are each indicated by a dotted line. In (a) and (b) of FIG. 6, only the green island-shaped hole transport layer 42G illustrated in FIG. 3 is shaded and indicated by a solid line, while the red island-shaped hole transport layer 42R and the blue island-shaped hole transport layer 42B illustrated in FIG. 3 are each indicated by a dotted line. In (a) and (b) of FIG. 7, only the blue island-shaped hole transport layer 42B illustrated in FIG. 3 is shaded and indicated by a solid line, while the red island-shaped hole transport layer 42R and the green island-shaped hole transport layer 42G illustrated in FIG. 3 are each indicated by a dotted line. (c) of FIG. 5 illustrates a schematic configuration of the display device 1 at a cross section taken along a line L3-L3' indicated in (b) of FIG. 5 when the red island-shaped hole transport layer 42R is formed. (c) of FIG. 6 illustrates a schematic configuration of the display device 1 at a cross section taken along a line L4-L4' indicated in (b) of FIG. 6 when the green island-shaped hole transport layer 42G is formed. (c) of FIG. 7 illustrates a schematic configuration of the display device 1 at a cross section taken along a line L5-L5' indicated in (b) of FIG. 7 when the blue island-shaped hole transport layer 42B is formed. In the explanation below, a "lower layer" refers to a layer formed in a process before the layer to be compared is formed, and an "upper layer" refers to a layer formed in a process after the layer to be compared is formed.

As illustrated in FIG. 1, the display device 1 according to the present embodiment has a configuration in which a light-emitting element layer 30, a sealing layer 50, and a function film (not illustrated) are provided on a circuit substrate 10 in that order from the side of a support body 11.

The circuit substrate 10 includes the support body 11 having insulating properties and a drive element layer 12 provided on the support body 11. For example, a thin film transistor (TFT) substrate is used as the circuit substrate 10.

The display device 1 may be a bendable flexible display device having flexibility, or may be a non-bendable inflexible display device having rigidity. Because of this, the support body 11 may be, for example, a glass substrate or a plastic substrate, or may be, for example, a plastic film such as a layered film in which a resin layer is formed on a lower face film. Examples of the material of the resin layer or the plastic substrate include polyimide. Examples of the material of the lower face film include polyethylene terephthalate (PET).

The drive element layer 12 includes a plurality of drive elements 21 provided on the support body 11, wiring lines (not illustrated), and a flattened layer 22 covering the drive elements 21 and the wiring lines. For example, the TFT is used for the drive element 21.

As illustrated in FIGS. 1 and 2, the light-emitting element layer 30 includes a red light-emitting element 31R formed corresponding to the red pixel 2R, a green-light-emitting element 31G formed corresponding to the green pixel 2G, a blue-light-emitting element 31B formed corresponding to the blue pixel 2B, and the bank 35. Hereinafter, when there is no need to distinguish the red light-emitting element 31R, the green-light-emitting element 31G, and the blue-light-emitting element 31B from one another, these are collectively referred to simply as the light-emitting element 31.

Note that in FIG. 1, only the red pixel 2R and the green pixel 2G are illustrated, while the blue pixel 2B is not illustrated. In FIG. 2, only the following constituent elements are illustrated: a common hole transport layer 41, to be explained later, in each light-emitting element 31; the red island-shaped hole transport layer 42R and the red light-emitting layer 43R, to be explained later, in the red light-emitting element 31R; the green island-shaped hole transport layer 42G and the green light-emitting layer 43G, to be explained later, in the green-light-emitting element 31G, and the blue island-shaped hole transport layer 42B and the blue light-emitting layer 43B, to be explained later, in the blue-light-emitting element 31B. Hereinafter, when there is no need to distinguish the red light-emitting layer 43R, the green light-emitting layer 43G, and the blue light-emitting layer 43B from one another, these are collectively referred to simply as the light-emitting layer 43.

As illustrated in FIG. 1, each light-emitting element 31 includes a first electrode 32 (lower electrode) provided on the flattened layer 22, a second electrode 34 (upper electrode) provided on an upper layer relative to the first electrode 32, and a function layer 33, including the light-emitting layer 43, provided between the first electrode 32 and the second electrode 34. In the present embodiment, the layers provided between the first electrode 32 and the second electrode 34 are collectively referred to as the function layer 33.

The first electrode 32 is electrically connected to the drive element 21. With this, each drive element 21 drives each light-emitting element 31. The first electrode 32 is an anode electrode (patterned anode electrode) formed in an island shape for each pixel 2, and the second electrode 34 is a cathode electrode (common cathode electrode) formed in a solid-like state common to all the pixels 2. However, the first electrode 32 may be the cathode electrode and the second electrode 34 may be the anode electrode. The anode electrode is an electrode configured to inject holes into the function layer 33 when a voltage is applied thereto. The cathode electrode is an electrode configured to inject electrons into the function layer 33 when a voltage is applied thereto.

In the display device 1, when the holes and the electrons recombine in the light-emitting layer 43 by a drive current between the first electrode 32 and the second electrode 34, light is emitted when excitons generated by the recombination transit from the excited state to the ground state (become deactivated).

When the display device 1 is a top-emitting type display device configured to extract light generated in the light-emitting layer 43 from the second electrode 34 side, the second electrode 34 has light-transmitting properties while the first electrode 32 has light reflectivity (specifically, a reflective layer), whereby the light emitted from the light-emitting layer 43 is directed upward. When the display device 1 is a bottom-emitting type display device configured to extract light generated in the light-emitting layer 43 from the first electrode 32 side, the second electrode 34 has light reflectivity (specifically, a reflective layer) while the first electrode 32 has light-transmitting properties, whereby the light emitted from the light-emitting layer 43 is directed upward.

Because of this, when the display device 1 is a top-emitting type display device, a reflective electrode made of a single metal such as gold (Au), platinum (Pt), nickel Ni) or silver (Ag), or an alloy of these metals is used as the reflective layer for the first electrode 32. The first electrode 32 may be a layered body in which a transparent electrode of indium tin oxide (ITO), indium zinc oxide (IZO) or the like, and the above-discussed reflective electrode are layered. For the second electrode 34, used is an electrode having light-transmitting properties, such as a transparent electrode of ITO, IZO or the like, a semitransparent electrode of a metal thin film or the like, which is a semipermeable reflective layer, or a layered body of the transparent electrode and the semitransparent electrode.

On the other hand, when the display device 1 is a bottom-emitting type display device, the electrode having light-transmitting properties, for example, is used for the first electrode 32, and the electrode having the light reflective layer, for example, is used for the second electrode 34.

As illustrated in FIGS. 1 and 4, the bank 35 is disposed between adjacent pixels 2, surrounds a peripheral portion of each light-emitting layer 43, and covers an edge of the first electrode 32. The bank 35 functions as a pixel separation wall that separates the pixels 2 from each other and covers the edge of the first electrode 32 as described above, and thus functions as an edge cover that prevents a short circuit between the first electrode 32 and the second electrode 34 due to electric field concentration at a pattern end portion of the first electrode 32.

In the bank 35, there is provided an opening 35a for each pixel 2. The opening 35a in the bank 35 is a light-emitting region (the red pixel light-emitting region RA, the green pixel light-emitting region GA, or the blue pixel light-emitting region BA (see FIGS. 2 and 3)) of each pixel 2. In FIG. 2, the bank 35 (not illustrated) is provided between the red pixel light-emitting region RA and the green pixel light-emitting region GA, and between the green pixel light-emitting region GA and the blue pixel light-emitting region BA.

The bank 35 is an organic insulating film. The bank 35 is formed by patterning a photosensitive organic material such as a polyimide resin or an acrylic resin by photolithography, for example.

When the display device 1 is, for example, an organic EL display device, the light-emitting element layer 30 is an organic light emitting diode (OLED) layer including an organic light emitting diode (OLED) as the light-emitting element 31, and an organic layer is used for the function layer 33 between the first electrode 32 and the second electrode 34. However, the present embodiment is not limited thereto, and the light-emitting element layer 30 may include an inorganic light emitting diode or a quantum dot light emitting diode instead of the OLED as a light-emitting element. The function layer 33 will be described in detail later.

The sealing layer 50 seals the entire surface of the display region. The sealing layer 50 performs thin film encapsulation on the light-emitting element layer 30, so as to prevent deterioration of the light-emitting element layer 30 due to the infiltration of moisture, oxygen, and the like from the outside.

As one example, the sealing layer 50 may have a triple-layer structure in which an inorganic layer, an organic layer, and an inorganic layer are layered in that order. Examples of a material for the organic layer include organic insulating materials (resin materials) such as a polysiloxane, silicon oxide carbide (SiOC), an acrylate, a polyurea, parylene, a polyimide, and a polyamide. Examples of a material for the inorganic layer include inorganic insulating materials such as silicon nitride, silicon oxide, silicon oxynitride, and $Al_2O_3$. Note that the structure of the sealing layer 50 is not limited to the triple-layer structure described above.

The function film is a film having a predetermined function such as an optical compensation function, a touch sensor function or a protection function, and is adhered to a surface of the display device 1 with an adhesive layer, for example.

Function Layer 33

As illustrated in FIG. 1, the function layer 33 has a configuration in which, for example, the common hole transport layer 41, the island-shaped hole transport layer 42, the light-emitting layer 43, and an electron transport layer 44 are layered in that order from the first electrode 32 side. The function layer 33 may include other layers such as a hole injection layer and an electron injection layer (not illustrated). One layer may have multiple functions. For example, the common hole transport layer 41 may also have a function as a hole injection layer, and the electron transport layer 44 may also have a function as an electron injection layer.

The common hole transport layer 41 and island-shaped hole transport layer 42 include a hole transport material and have a function to enhance the hole transport efficiency from the first electrode 32 to the light-emitting layer 43. The common hole transport layer 41 is formed on the first electrode 32 and on the bank 35 in a solid-like state common to all the pixels 2. The island-shaped hole transport layer 42 is formed on the common hole transport layer 41 in an island shape (individually) for each pixel 2. The island-shaped hole transport layer 42 includes the red island-shaped hole transport layer 42R, the green island-shaped hole transport layer 42G, and the blue island-shaped hole transport layer 42B, as illustrated in FIGS. 1 and 2.

The light-emitting layer 43 functions to emit light by making the holes injected from the first electrode 32 side recombine with the electrons injected from the second electrode 34 side. The light-emitting layer 43 is formed on the island-shaped hole transport layer 42 in an island shape (individually) for each pixel 2. The light-emitting layer 43 includes the red light-emitting layer 43R, the green light-emitting layer 43G, and the blue light-emitting layer 43B, as illustrated in FIGS. 1 and 2.

The electron transport layer 44 is a layer having a function to enhance the electron transport efficiency from the second electrode 34 to the light-emitting layer 43. The electron transport layer 44 may be formed on the light-emitting layer 43 in a solid-like state common to all the pixels 2 as illustrated in FIG. 1, or may be formed in an island shape (individual) for each pixel 2 although not illustrated in the drawings.

Known hole transport materials may be used for the common hole transport layer 41, the red island-shaped hole transport layer 42R, the green island-shaped hole transport layer 42G, and the blue island-shaped hole transport layer 42B. Further, known luminescent materials may be used for the red light-emitting layer 43R, the green light-emitting layer 43G, and the blue light-emitting layer 43B. The electron transport layer 44 may use a known electron transport material.

Examples of the hole transport material used for the common hole transport layer 41 include chainlike or heterocyclic conjugated monomers, oligomers, or polymers, such as naphthalene, anthracene, azatriphenylene, fluorenone, hydrazone, stilbene, triphenylene, benzine, styrylamine, triphenylamine, porphyrin, triazole, imidazole, oxadiazole, oxazole, polyarylalkane, phenylenediamine, arylamine and derivatives thereof, thiophene-based compounds, polysilane-based compounds, vinylcarbazole-based compounds, and aniline-based compounds. More specifically, for example, 1,3-bis(carbazole-9-yl)benzene (mCP), di-[4-(N,N-ditolyl-amino)-phenyl]cyclohexane (TAPC), 9,10-diphenylanthracene-2-sulfonate (DPAS), N,N'-diphenyl-N,N'-(4-(di(3-tolyl)amino)phenyl)-1,1'-biphenyl-4,4'-diamine (DNTPD), iridium(III)tris[N,N'-diphenylbenzimidazole-2-ylidene-C2,C2'](Ir(dpbic)3), 4,4',4''-tris-(N-carbazolyl)-triphenylamine (TCTA), 2,2-bis(p-trimellitic oxyphenyl)propanoic acid anhydride (BTPD), bis[4-(p,p-ditolylamino)phenyl]diphenylsilane (DTASi), and 9-phenyl-3-[4-(10-phenyl-9-anthryl)phenyl]-9H-carbazole (PCzPA) are used.

The common hole transport layer 41 may be formed with an intrinsic hole transport material that is not doped with impurities, or may be doped with impurities in order to raise conductivity or the like.

Examples of the hole transport material used for the red island-shaped hole transport layer 42R include a hole transport material such as the above-described PCzPA. It is preferable that the same material as that of the common hole transport layer 41 be used as the material of the red island-shaped hole transport layer 42R. By using the same material as the material of the common hole transport layer 41 for the material of the red island-shaped hole transport layer 42R, the red island-shaped hole transport layer 42R can be considered to be electrically the same layer as the common hole transport layer 41 (that is, part of the common hole transport layer 41). As illustrated in FIGS. 1 and 2, at a portion where the common hole transport layer 41 and the red island-shaped hole transport layer 42R overlap each other, the red island-shaped hole transport layer 42R is layered on the common hole transport layer 41.

Examples of the hole transport material used for the green island-shaped hole transport layer 42G include N,N'-di(naphthalene-1-yl)-N,N'-diphenyl-benzidine (α-NPD).

Examples of the hole transport material used for the blue island-shaped hole transport layer 42B include 2,3,6,7,10,11-Hexacyano-1,4,5,8,9,12-hexaazatriphenylene (HAT-CN) and copper phthalocyanine (CuPc).

Examples of the red luminescent material used for the red light-emitting layer 43R include a red fluorescent luminescent material such as tetraphenyldibenzoperiflanthene (DBP) or (E)-2-{2-[4-(dimethylamino)styryl]-6-methyl-4H-pyran-4-ylidene}malononitrile (DCM), or a red phosphorescent luminescent material such as tris(1-phenylisoquinoline)iridium (III) (Ir(piq)3) or bis(2-benzo[b]thiophene-2-yl-pyridine) (acetylacetonate)iridium (III) (Ir(btp)2(acac)).

Examples of the green luminescent material used for the green light-emitting layer 43G include a green phosphorescent luminescent material such as 3-(2-benzothiazolyl)-7-(diethylamino)coumarin (coumarin6), 8-hydroxyquinoline aluminum (Alq3), 1,2,3,5-tetrakis(carbazole-9-yl)-4,6-dicyanobenzene (4CzIPN), 1,2,3,4-tetrakis(carbazole-9-yl)-5,6-dicyanobenzene (4CzPN), or (2-phenylpyridine)iridium (Ir(ppy)3).

Examples of the blue luminescent material used for the blue light-emitting layer 43B include a blue fluorescent luminescent material such as 2,5,8,11-tetra-tert-butylperylene (TBPe), bis[4-(9,9-dimethyl-9,10-dihydroacridine)phenyl]sulfone (DMAC-DPS), perylene or 4,5-bis(carbazole-9-yl)-1,2-dicyanobenzene (2CzPN), or a blue phosphorescent luminescent material such as iridium(III)bis[4,6-(difluorophenyl)-pyridinato-N,CT]picolinate (FIrpic).

Examples of electron transporting materials used for the electron transport layer 44 include quinoline, perylene, phenanthroline, bisstyryl, pyrazine, triazole, oxazole, oxadiazole, fluorenone, derivatives or metal complexes of these materials, and lithium fluoride (LiF). More specific examples thereof include bis[(2-diphenylphosphoryl)phenyl]ether (DPEPO), 4,7-diphenyl-1,10-phenanthroline (Bphen), 3,3'-bis(9H-carbazole-9-yl)biphenyl (mCBP), 2,9-dimethyl-4,7-diphenyl-1,10-phenanthroline (BCP), 1,3,5-tris(N-phenylbenzimidazole-2-yl)benzene (TPBI), 3-phenyl-4(1'-naphthyl)-5-phenyl-1,2,4-triazole (TAZ), 1,10-phenanthroline, Alq(tris(8-hydroxyquinoline)aluminum), LiF, etc.

As illustrated in FIG. 1 and FIG. 2, in the red pixel 2R, the red island-shaped hole transport layer 42R and the red light-emitting layer 43R are layered on the common hole transport layer 41 in that order adjacent to each other. In the green pixel 2G, the green island-shaped hole transport layer 42G and the green light-emitting layer 43G are layered on the common hole transport layer 41 in that order adjacent to each other. In the blue pixel 2B, the blue island-shaped hole transport layer 42B and the blue light-emitting layer 43B are layered on the common hole transport layer 41 in that order adjacent to each other. As illustrated in FIG. 1, the electron transport layer 44 is layered on the red light-emitting layer 43R, the green light-emitting layer 43G, and the blue light-emitting layer 43B in the red pixel 2R, the green pixel 2G, and the blue pixel 2B, respectively.

As described above, the holes injected into the light-emitting layer 43 from the first electrode 32 and the electrons injected into the light-emitting layer 43 from the second electrode 34 are recombined in the light-emitting layer 43. At this time, the energy required for this recombination is different in each of the red light-emitting layer 43R, the green light-emitting layer 43G, and the blue light-emitting layer 43B. Because of this, in a case where only the common hole transport layer 41 is provided as the hole transport layer, holes cannot be injected in accordance with the materials and characteristics of the red light-emitting layer 43R, the green light-emitting layer 43G, and the blue light-emitting layer 43B.

Holes not having been injected into the light-emitting layer 43 may stay in the common hole transport layer 41. Further, since the holes staying in the common hole transport layer 41 are not recombined in the light-emitting layer 43, the electrons injected into the light-emitting layer 43 from the electron transport layer 44 decrease in number, and as a result, the excess electrons stay in the electron transport layer 44. Thus, as described above, the island-shaped hole transport layer 42 (the red island-shaped hole transport layer 42R, the green island-shaped hole transport layer 42G, and the blue island-shaped hole transport layer 42B) corresponding to each pixel 2 is individually formed between the common hole transport layer 41 and the light-emitting layer 43 in each pixel 2.

It is preferable that the same material as that of the common hole transport layer 41 be used as the material of the red island-shaped hole transport layer 42R.

Therefore, it is desirable that the highest occupied molecular orbital level (HOMO level) of the island-shaped hole transport layer 42 in each of the pixels 2 is equal to the HOMO level of the common hole transport layer 41, or is shallower than the HOMO level of the common hole transport layer 41 and is deeper than the HOMO level of the light-emitting layer 43 of the pixel 2, which is layered in an adjacent manner. This makes it possible to efficiently inject holes into the light-emitting layer 43 for each pixel 2. As a result, it is possible to make the light-emitting layer 43 efficiently emit light for each pixel 2.

It is desirable that the lowest unoccupied molecular orbital level (LUMO level) of the island-shaped hole transport layer 42 in each of the pixels 2 be equal to the LUMO level of the common hole transport layer 41, or be deeper than the LUMO level of the common hole transport layer 41 and be shallower than the LUMO level of the light-emitting layer 43 of the pixel 2, which is layered in an adjacent manner. This makes it possible to efficiently inject holes into the light-emitting layer 43 for each pixel 2. As a result, it is possible to make the light-emitting layer 43 efficiently emit light for each pixel 2.

For example, when the above configuration is explained while taking the red pixel 2R as an example, it is desirable that the HOMO level of the red island-shaped hole transport layer 42R in the red pixel 2R be equal to the HOMO level of the common hole transport layer 41 or shallower than the HOMO level of the common hole transport layer 41, and be deeper than the HOMO level of the red light-emitting layer 43R of the red pixel 2R, which is layered in an adjacent manner. When this is described by using a formula, a relation of |HOMO level of common hole transport layer 41|≥|HOMO level of red island-shaped hole transport layer 42R"›|HOMO level of red light-emitting layer 43R| is satisfied. It is desirable that the LUMO level of the red island-shaped hole transport layer 42R in the red pixel 2R be equal to the LUMO level of the common hole transport layer 41 or deeper than the LUMO level of the common hole transport layer 41, and be shallower than the LUMO level of the red light-emitting layer 43R of the red pixel 2, which is layered in an adjacent manner. When this is described by using a formula, a relation of |LUMO level of common hole transport layer 41|<|LUMO level of red island-shaped hole transport layer 42R|≤|LUMO level of red light-emitting layer 43R| is satisfied.

There arises no problem as long as the island-shaped hole transport layer 42 is able to prevent a situation in which electrons enters into the common hole transport layer 41 from the light-emitting layer 43. As long as a relation of the LUMO level of the common hole transport layer 41 >> the LUMO level of the light-emitting layer 43 is satisfied, the LUMO level of the common hole transport layer 41 may take any level of value without causing a problem.

As illustrated in FIG. 1, FIG. 2, and (b) and (c) of FIG. 5, the red island-shaped hole transport layer 42R includes the film thickness securing region 42aR having a constant film thickness (desired film thickness), and the shadow region 42bR with a gradually thinned film thickness. The shadow region 42bR is provided outside the film thickness securing region 42aR (to rephrase, on a peripheral portion of the red island-shaped hole transport layer 42R). As illustrated in FIG. 1, FIG. 2, and (b) and (c) of FIG. 6, the green island-shaped hole transport layer 42G includes the film thickness securing region 42aG having a constant film thickness (desired film thickness), and the shadow region 42bG with a gradually thinned film thickness. The shadow region 42bG is provided outside the film thickness securing region 42aG (to rephrase, on a peripheral portion of the green island-shaped hole transport layer 42G). As illustrated in FIG. 2, and (b) and (c) of FIG. 7, the blue island-shaped hole transport layer 42B includes the film thickness securing region 42aB having a constant film thickness (desired film thickness), and the shadow region 42bB with a gradually thinned film thickness. The shadow region 42bB is provided outside the film thickness securing region 42aB (to rephrase, on a peripheral portion of the blue island-shaped hole transport layer 42B). Note that in FIG. 2, the shadow region 42bB is not illustrated.

As illustrated in FIG. 1, the red light-emitting layer 43R includes a film thickness securing region 43aR having a constant film thickness (desired film thickness), and a shadow region 43bR with a gradually thinned film thickness. The green light-emitting layer 43G includes a film thickness securing region 43aG having a constant film thickness (desired film thickness), and a shadow region 43bG with a gradually thinned film thickness. Although not illustrated, the blue light-emitting layer 43B also includes a film thickness securing region (hereinafter referred to as a "film thickness securing region 43aB") having a constant film thickness (desired film thickness), and a shadow region (hereinafter referred to as a "shadow region 43bB") with a gradually thinned film thickness.

The shadow region 43bR is provided outside the film thickness securing region 43aR (to rephrase, on a peripheral portion of the red light-emitting layer 43R). The shadow region 43bG is provided outside the film thickness securing region 43aG (to rephrase, on a peripheral portion of the green light-emitting layer 43G). The shadow region 43bB is provided outside the film thickness securing region 43aB (to rephrase, on a peripheral portion of the blue light-emitting layer 43B).

In a plan view, the red light-emitting layer 43R is provided extending over the opening 35a in the bank 35 to serve as the red pixel light-emitting region RA and overlapping with a portion between the stated opening 35a and the opening 35a adjacent to the stated opening 35a. Likewise, in the plan view, the green light-emitting layer 43G is provided extending over the opening 35a in the bank 35 to serve as the green pixel light-emitting region GA and overlapping with a portion between the stated opening 35a and the opening 35a adjacent to the stated opening 35a. The red light-emitting layer 43R is formed larger than the red pixel light-emitting region RA. The green light-emitting layer 43G is formed larger than the green pixel light-emitting region GA. Because of this, the shadow region 43bR of the red light-emitting layer 43R and the shadow region 43b G of the green light-emitting layer 43G overlap each other over a portion of the bank 35 between the red pixel light-emitting region RA and the green pixel light-emitting region GA. A portion between the red pixel light-emitting region RA and the green pixel light-emitting region GA is a non light-emitting region. Due to this, in FIG. 1, an end portion of the film thickness securing region 43aG of the green light-emitting layer 43G is coincident with an end portion of the shadow region 43bR of the red light-emitting layer 43R, but it is not particularly needed for them to be coincident with each other. Likewise, in FIG. 1, an end portion of the film thickness securing region 43aR of the red light-emitting layer 43R is coincident with an end portion of the shadow region 43bG of the green light-emitting layer 43G, but it is not particularly needed for them to be coincident with each other.

As illustrated in FIGS. 1 and 2, an area of the red island-shaped hole transport layer 42R provided corresponding to the red pixel 2R is larger than that of the green island-shaped hole transport layer 42G provided corresponding to the green pixel 2G, and is also larger than that of the red light-emitting layer 43R provided corresponding to the red pixel 2R.

As illustrated in FIGS. 1 and 2, an area of the film thickness securing region 42aR of the red island-shaped hole transport layer 42R is larger than that of the film thickness securing region 43aR of the red light-emitting layer 43R, and an end portion of the shadow region 42bR of the red island-shaped hole transport layer 42R is provided outside the red light-emitting layer 43R in a plan view. As illustrated in FIG. 1, FIG. 2, and (b) and (c) of FIG. 5, the area of the film thickness securing region 42aR of the red island-shaped hole transport layer 42R is larger than an area of the red pixel light-emitting region 2R. Thus, the film thickness securing region 42aR of the red island-shaped hole transport layer 42R is provided across the red pixel light-emitting region RA of the red pixel RA in a direction in which the red pixel 2R and the green pixel 2G are adjacent to each other. That is, the film thickness securing region 42aR includes the red pixel light-emitting region RA in the direction described above, and extends, beyond the red pixel light-emitting region RA, to the outside of the red pixel light-emitting region RA. A part of the shadow region 42bR of the red island-shaped hole transport layer 42R is provided at a part within the green pixel light-emitting region GA adjacent to the red pixel light-emitting region RA.

As illustrated in (b) of FIG. 6, the green island-shaped hole transport layer 42G of the green pixel 2G has a rectangular shape in which, in a plan view, the length in a direction sandwiched by the red pixels 2R is shorter while the length in a direction sandwiched by the blue pixels 2B is longer.

More specifically, the film thickness securing region 42aG of the green island-shaped hole transport layer 42G in the blue pixel 2B direction is larger than the opening 35a of the bank 35 corresponding to the green pixel 2G, and is formed overriding the bank 35.

On the other hand, the film thickness securing region 42aG of the green island-shaped hole transport layer 42G in the red pixel 2R direction is located within the opening 35a of the bank 35 corresponding to the green pixel 2G, and the shadow region 42bG is formed overriding the bank 35 from the inside of the opening 35a. Accordingly, as illustrated in FIG. 1 and (b) of FIG. 6, the film thickness securing region 42aG of the green island-shaped hole transport layer 42G is located at the inside of the green pixel light-emitting region GA of the green pixel 2G in a direction in which the red pixel 2R and the green pixel 2G are adjacent to each other, and a part of the shadow region 42bG of the green island-shaped hole transport layer 42G in the direction described above is provided at a part within the green pixel light-emitting region GA in the above-described direction.

As illustrated in FIGS. 1 and 2, the film thickness securing region 42aG of the green island-shaped hole transport layer 42G is located at the inside of the film thickness securing region 43aG of the green light-emitting layer 43G in the direction in which the red pixel 2R and the green pixel 2G are adjacent to each other, and the shadow region 42bG of the green island-shaped hole transport layer 42G in the direction described above is provided at the inside of the green light-emitting layer 43G in the above-described direction.

Then, at the inside of the opening 35a of the bank 35 corresponding to the green pixel 2G, the shadow region 42bR of the red island-shaped hole transport layer 42R adjacent to the green pixel 2G is formed overriding the bank 35 between the green pixel 2G and the red pixel 2R.

Because of this, as illustrated in FIGS. 1 and 2, part of the shadow region 42bR of the red island-shaped hole transport layer 42R and part of the shadow region 42bG of the green island-shaped hole transport layer 42G overlap each other at a portion within the green pixel light-emitting region GA. In other words, in the opening 35a of the bank 35 corresponding to the green pixel 2G, the shadow region 42bR of the red island-shaped hole transport layer 42R makes contact with the green island-shaped hole transport layer 42G. More specifically, the shadow region 42bR and the shadow region 42bG overlap each other in a region between a portion on the bank 35 between the red pixel light-emitting region RA and the green pixel light-emitting region GA, and a portion within the green pixel light-emitting region GA.

In the present embodiment, as described above, since part of the shadow region 42bR and part of the shadow region 42bG overlap each other at a portion within the green pixel light-emitting region GA, it is desirable to perform film thickness adjustment on the red island-shaped hole transport layer 42R and the green island-shaped hole transport layer 42G in the green pixel light-emitting region GA. Accordingly, as illustrated in FIG. 1 and FIG. 2, it is desirable that an end portion of the film thickness securing region 42aG of the green island-shaped hole transport layer 42G be coincident with an end portion of the shadow region 42bR of the red island-shaped hole transport layer 42R, in the green pixel light-emitting region GA.

Although not illustrated, the blue light-emitting layer 43B is provided extending over the opening 35a in the bank 35 to serve as the blue pixel light-emitting region BA and overlapping with a portion between the stated opening 35a and the opening 35a adjacent to the stated opening 35a, in a plan view. That is, an end portion of the blue light-emitting layer 43B is located, similarly to those of the red light-emitting layer 43R and the green light-emitting layer 43G, in a non light-emitting region, and each of the light-emitting layers 43 is so formed as not to overlap with each other in the pixel 2 adjacent to the corresponding pixel 2.

Each of the light-emitting layers 43 is formed larger than the light-emitting region (effective pixel) of the corresponding pixel 2. Therefore, the blue light-emitting layer 43B is formed larger than the blue pixel light-emitting region BA.

As illustrated in FIG. 3 and (b) of FIG. 5, the shadow region 42bR of the red island-shaped hole transport layer 42R is not formed within the blue pixel light-emitting region BA in the PenTile arrangement. Because of this, the blue island-shaped hole transport layer 42B does not have to make part of the shadow region 42bB overlap with part of the shadow region 42bR at a portion within the blue pixel light-emitting region BA. Thus, although not illustrated, the blue island-shaped hole transport layer 42B provided corresponding to the blue pixel 2B has the same size as the blue light-emitting layer 43B, for example. Accordingly, as illustrated in FIG. 3, the blue island-shaped hole transport layer 42B is so formed as to have an area smaller than that of the red island-shaped hole transport layer 42R and larger than that of the green island-shaped hole transport layer 42G.

However, like in a case where the display device 1 has pixel arrangement referred to as a stripe array in which, for example, a red pixel 2R line, a green pixel 2G line, and a blue pixel 2B line are arrayed parallel to one another, when a side of the opening 35a to serve as the blue pixel light-emitting region BA and a side of the opening 35a to serve as the red pixel light-emitting region RA are adjacent to and oppose each other, it is desirable to make part of the shadow region 42bB overlap with part of the shadow region 42bR at a portion within the blue pixel light-emitting region BA.

The layering order of the island-shaped hole transport layers 42 at the portion where the island-shaped hole transport layers 42 overlap each other is not limited to any specific one, from the perspective of film thickness uniformity. However, from the perspective of electrical characteristics, the red island-shaped hole transport layer 42R, the green island-shaped hole transport layer 42G, and the blue island-shaped hole transport layer 42B are preferably layered in that order from the common hole transport layer 41 side.

The display device 1 according to the present embodiment is a display device of the microcavity (microresonator) type. As described above, in each light-emitting element 31, one of the first electrode 32 and the second electrode 34 includes a reflective layer, and the other one of them includes a semipermeable reflective layer. In each light-emitting element 31, the light emitted from the light-emitting layer 43 is multiply reflected between the reflective layer and the semipermeable reflective layer to achieve resonance, whereby the light emission intensity of a specific wavelength is amplified.

In other words, the distance between the reflective layer and the semipermeable reflective layer in the red light-emitting element 31R is an optical path length in which the peak wavelength of red light emitted from the red pixel 2R resonates. In other words, the distance between the reflective layer and the semipermeable reflective layer in the green light-emitting element 31G is an optical path length in which the peak wavelength of green light emitted from the green pixel 2G resonates. In other words, the distance between the reflective layer and the semipermeable reflective layer in the blue light-emitting element 31B is an optical path length in which the peak wavelength of blue light emitted from the blue pixel 2B resonates.

In the present embodiment, as illustrated in FIG. 1 and FIG. 2, in order to cause the distance between the reflective layer and the semipermeable reflective layer (for example, the distance between the first electrode and the second electrode 34) to be an optical path length (resonator length) in which the peak wavelength of color light emitted from each pixel 2 resonates, the thickness of at least the island-shaped hole transport layer 42 (for example, at least the island-shaped hole transport layer 42 of the island-shaped hole transport layer 42 and the light-emitting layer 43) is set for each pixel 2.

Of the light emitted from the red pixel 2R, the green pixel 2G, and the blue pixel 2B, the red light has the longest wavelength of peak wavelength. Thus, in the present embodiment, the film thickness of the film thickness securing region 42aR in the red island-shaped hole transport layer 42R is formed to be thicker than the film thickness of the island-shaped hole transport layers 42 other than the red island-shaped hole transport layer 42R (in the present embodiment, the green island-shaped hole transport layer 42G and the blue island-shaped hole transport layer 42B).

In addition, in the green pixel light-emitting region GA, the distance between the reflective layer and the semipermeable reflective layer at the portion where the shadow region 42bR of the red island-shaped hole transport layer 42R overlaps with the shadow region 42bG of the green island-shaped hole transport layer 42G is set in such a manner as to have an optical path length in which the peak wavelength of the green light resonates.

Manufacturing Method for Display Device 1

Next, with reference to FIG. 1 and FIGS. 8 to 16, a manufacturing method for the display device 1 will be described below.

A manufacture process for the display device 1 according to the present embodiment includes, for example, a circuit substrate forming step (S1), a light-emitting element layer forming step (S2), a sealing layer forming step (S3), and a function film attachment step (S4).

First, as illustrated in FIG. 1, by using a known technique, the drive element layer 12 including the drive element 21 and wiring lines (not illustrated), and the flattened layer 22 covering the above drive element 21 and wiring lines is formed on the support body 11. As a result, the circuit substrate 10 described above is formed (S1). Next, the light-emitting element layer 30 is formed on the circuit substrate 10 formed as discussed above (S2). Next, the sealing layer 50 is formed (S3). Thereafter, the function film (not illustrated) is attached to a layered body obtained (in other words, a layered body formed by layering the light-emitting element layer 30 and the sealing layer 50 on the circuit substrate 10) (S4). In a case where a large mother substrate is used as the support body 11, after the formation of the above-discussed layered body, the layered body is sheared so as to obtain a plurality of individual pieces, and then the function films (not illustrated) are attached to the obtained individual pieces.

The light-emitting element layer forming step (S2) includes, for example, a first electrode forming step (S11), a bank forming step (S12), a function layer forming step (S13), and a second electrode forming step (S14).

In the light-emitting element layer forming step (S4), first, the first electrode 32 is patterned in an island shape for each pixel 2 (S11), by using a known technique, on the circuit substrate 10 formed in the circuit substrate forming step (S1). Next, the bank 35 is formed between adjacent pixels 2, by using a known technique, in such a manner as to cover the edge of the first electrode 32 (S12). Thereafter, the function layer 33 is formed on the first electrode 32 and the bank 35 (S13). The function layer forming step (S13) will be described in detail later. Next, the second electrode 34 is formed in common for each of the pixels 2 by using a known technique, for example, in such a manner as to cover the function layer 33 (S14).

The function layer forming step (S13) includes, for example, a common hole transport layer forming step (S21), an island-shaped hole transport layer forming step (S22), a light-emitting layer forming step (S23), and an electron transport layer forming step (S24).

A vacuum vapor deposition technique using a vapor deposition mask is used for forming the function layer 33. In the function layer forming step (S13), first, the material of the common hole transport layer 41 is vapor-deposited on the entire surface of the display region on the circuit substrate 10, on which the first electrode 32 is formed, by using an open mask in which the entire display region is open, for example, as the vapor deposition mask. As a result, the common hole transport layer 41 is formed in common for each of the pixels 2 (S21).

Next, the material of the island-shaped hole transport layer 42 is vapor-deposited on the common hole transport layer 41 for each pixel 2. As a result, the island-shaped hole transport layer 42 is formed for each pixel 2 (S22).

Subsequently, the material of the light-emitting layer 43 is vapor-deposited on the island-shaped hole transport layer 42 for each pixel 2. As a result, the light-emitting layer 43 is formed for each pixel 2 (S23).

Thereafter, the material of the electron transport layer 44 is vapor-deposited on the entire surface of the display region on the light-emitting layer 43 by using an open mask in which the entire display region is open, for example, as the vapor deposition mask. As a result, the electron transport layer 44 is formed in common for each of the pixels 2 (S21).

In the island-shaped hole transport layer forming step (S22) and the light-emitting layer forming step (S23), separately patterning vapor deposition is performed by using an FMM, as a vapor deposition mask, having a plurality of mask openings (openings, through-holes) that allow vapor deposition particles to pass therethrough at the time of vapor deposition. As a result, a vapor deposition film having an island-shaped pattern is film-formed for each pixel 2.

The vapor deposition of the island-shaped hole transport layer 42 and the light-emitting layer 43 is performed for each of the red pixel 2R, the green pixel 2G, and the blue pixel 2B.

Thus, the island-shaped hole transport layer forming step (S22) includes a red island-shaped hole transport layer forming step (S31), a green island-shaped hole transport layer forming step (S32), and a blue island-shaped hole transport layer forming step (S33). As described above, from the perspective of electrical characteristics, the red island-shaped hole transport layer 42R, the green island-shaped hole transport layer 42G, and the blue island-shaped hole transport layer 42B are preferably layered in that order from the common hole transport layer 41 side. Accordingly, the red island-shaped hole transport layer forming step (S31), the green island-shaped hole transport layer forming step (S32), and the blue island-shaped hole transport layer forming step (S33) are preferably performed in that order.

In the red island-shaped hole transport layer forming step (S31), the red island-shaped hole transport layer 42R is formed as the island-shaped hole transport layer 42 in the red pixel 2R. In the green island-shaped hole transport layer forming step (S32), the green island-shaped hole transport layer 42G is formed as the island-shaped hole transport layer 42 in the green pixel 2G. In the blue island-shaped hole transport layer forming step (S33), the blue island-shaped hole transport layer 42B is formed as the island-shaped hole transport layer 42 in the blue pixel 2B.

The light-emitting layer forming step (S23) includes a red light-emitting layer forming step (S41), a green light-emitting layer forming step (S42), and a blue light-emitting layer forming step (S43). The red light-emitting layer forming step (S41), the green light-emitting layer forming step (S42), and the blue light-emitting layer forming step (S43) are preferably performed in that order.

In the red light-emitting layer forming step (S41), the red light-emitting layer 43R is formed as the light-emitting layer 43 in the red pixel 2R. In the green light-emitting layer forming step (S42), the green light-emitting layer 43G is formed as the light-emitting layer 43 in the green pixel 2G. In the blue light-emitting layer forming step (S43), the blue light-emitting layer 43B is formed as the light-emitting layer 43 in the blue pixel 2B.

In the present embodiment, the size of the island-shaped hole transport layer 42 is different for each color of the pixel 2. For this reason, a dedicated vapor deposition mask (FMM) is used for each color of the pixel 2 in the film formation of each of the island-shaped hole transport layers 42.

Figure 8:
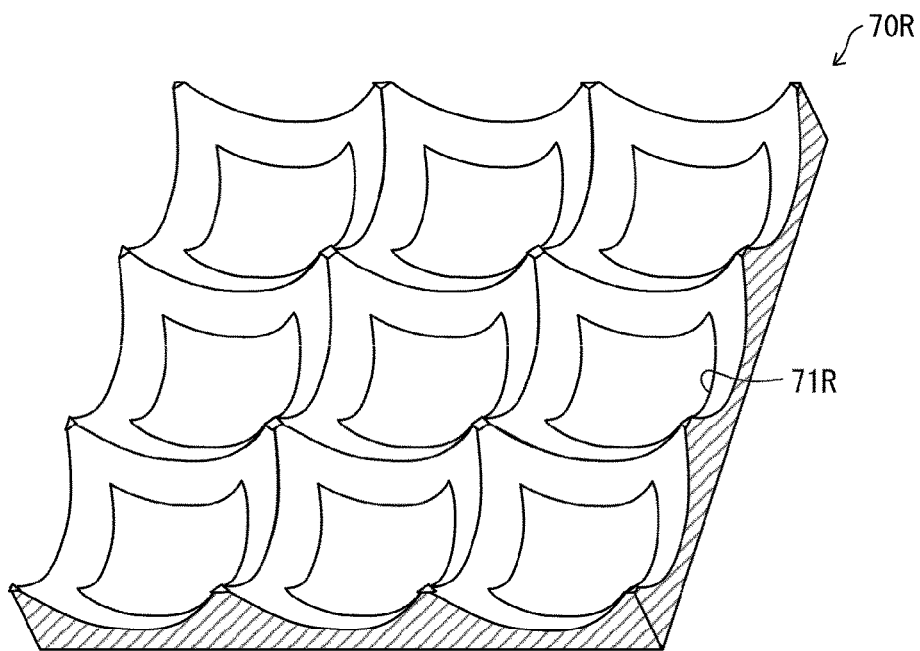
FIG. 8 is a perspective view illustrating a schematic configuration of a vapor deposition mask used for forming a red island-shaped hole transport layer according to the embodiment of the disclosure.
Figure 9:
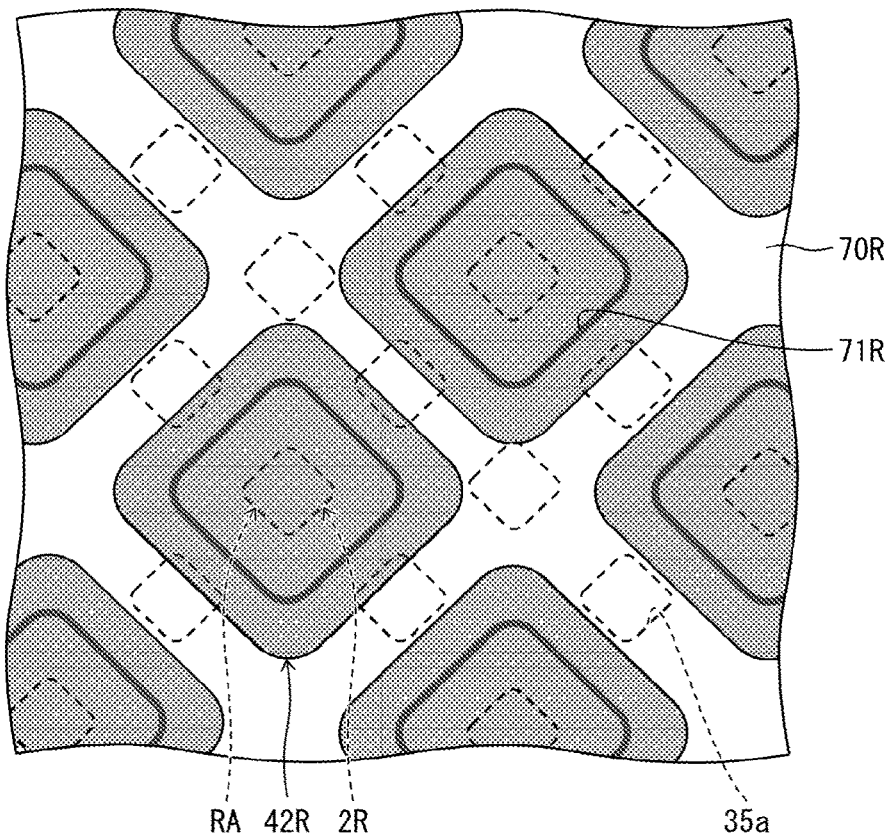
FIG. 9 is a plan view illustrating a relationship between a mask opening of a vapor deposition mask used for forming a red island-shaped hole transport layer, and a red island-shaped hole transport layer and a red pixel light-emitting region, according to an embodiment of the disclosure.
Figure 10:
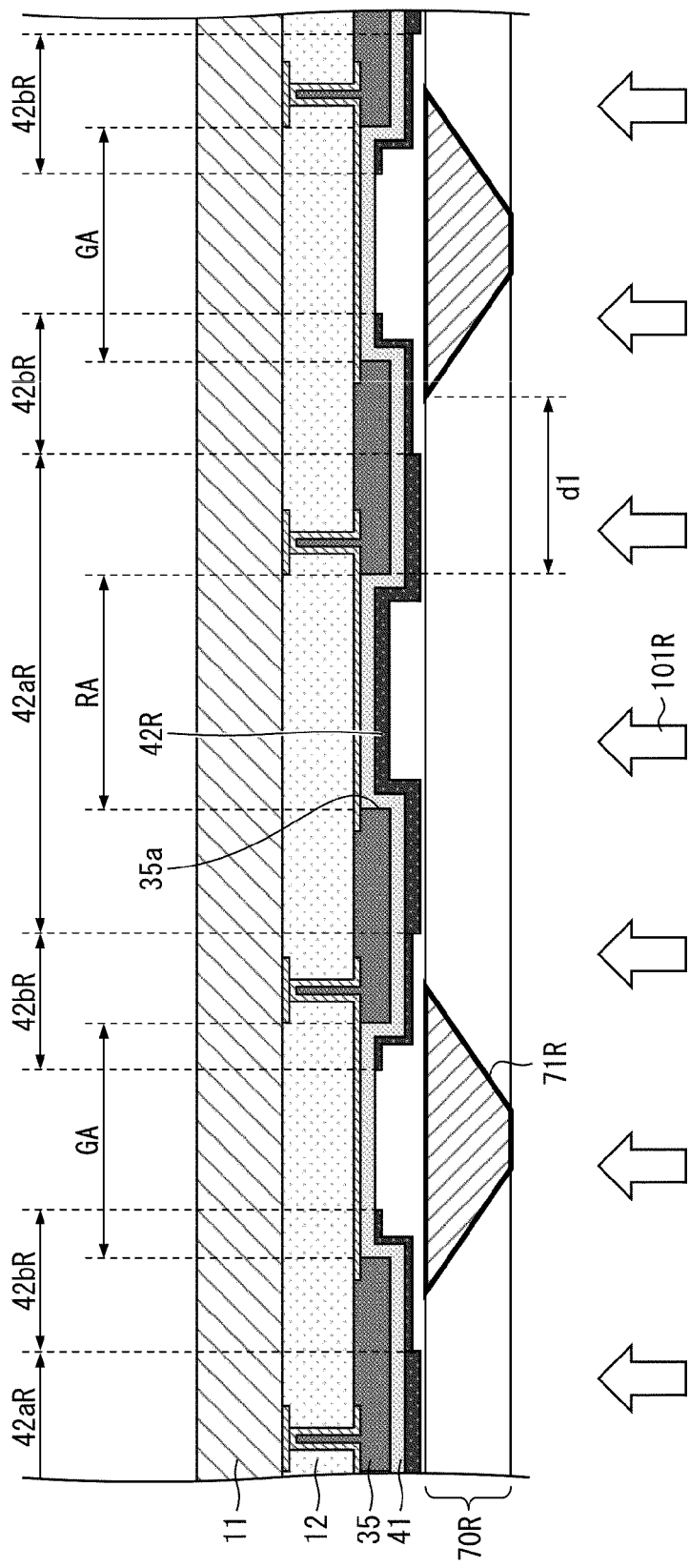
FIG. 10 is a cross-sectional view illustrating a step of forming a red island-shaped hole transport layer in a display device according to an embodiment of the disclosure.

FIG. 8 is a perspective view illustrating a schematic configuration of a vapor deposition mask 70R used for forming the red island-shaped hole transport layer 42R. FIG. 9 is a plan view illustrating a relationship between a mask opening 71R of the vapor deposition mask 70R used for forming the red island-shaped hole transport layer 42R, and the red island-shaped hole transport layer 42R and the red pixel light-emitting region RA. FIG. 10 is a cross-sectional view illustrating a step of forming the red island-shaped hole transport layer 42R in the display device 1 (S31). In FIG. 9, for convenience of illustration, part of the pixel arrangement is omitted.

In the red island-shaped hole transport layer forming step (S31), separately patterning vapor deposition is performed by using the vapor deposition mask 70R, as the FMM, provided with the mask opening 71R for each red pixel 2R corresponding to the red island-shaped hole transport layer 42R, as illustrated in FIGS. 8 to 10.

In the present embodiment, in order that part of the shadow region 42bR of the red island-shaped hole transport layer 42R overlaps with part of the shadow region 42bG of the green island-shaped hole transport layer 42G at a portion within the green pixel light-emitting region GA, used is a vapor deposition mask, as the vapor deposition mask 70R, in which a distance d1 (third distance) between an opening end face of the vapor deposition mask 70R (an end face of the mask opening 71R) and a circumferential end portion of the red pixel light-emitting region RA in a direction in which the red pixel 2R and the green pixel 2G are adjacent to each other, as illustrated in FIG. 10, is longer than a distance d3 (fourth distance; see FIG. 14) between an opening end face of a vapor deposition mask 80R (an end face of a mask opening 81R) used for forming the red light-emitting layer 43R, to be explained later, and a circumferential end portion of the red pixel light-emitting region RA in the direction described above, and is also longer than a distance d4 (second distance; see FIG. 16; d3=d4) between an opening end face of a vapor deposition mask 80G (an end face of a mask opening 81G) used for forming the green light-emitting layer 43G, to be explained later, and a circumferential end portion of the green pixel light-emitting region GA in the direction described above. The distance d3 and the distance d4 are longer than a distance d2 (first distance; see FIG. 12) between an opening end face of a vapor deposition mask 70G (an end face of a mask opening 71G) used for forming the green island-shaped hole transport layer 42G, to be explained later, and the circumferential end portion of the green pixel light-emitting region GA in the direction described above.

Accordingly, as the vapor deposition mask 70R, for example, as illustrated in FIG. 9 and FIG. 10, used is a vapor deposition mask having the mask opening 71R (opening) whose area is larger than an area of the red pixel light-emitting region RA (strictly speaking, the opening 35a to serve as the red pixel light-emitting region RA in the present process) surrounded by the bank 35, and is also larger than an area of the mask opening 71G of the vapor deposition mask 70G (see FIGS. 11 and 12) used in the green island-shaped hole transport layer forming step (S32) to be explained later as well as an area of the mask opening 81R of the vapor deposition mask 80R (see FIGS. 13 and 14) used in the red light-emitting layer forming step (S41) to be explained later.

As illustrated in FIG. 10, the mask opening 71R functions as a passage that allows a red island-shaped hole transport material to pass through as vapor deposition particles 101R during vapor deposition. The regions other than the mask openings 71R in the vapor deposition mask 70R are non-openings, and function as blocking portions configured to block the flow of the vapor deposition particles 101R during vapor deposition. As a result, only the vapor deposition particles 101R having passed through each mask opening 71R reach the film formed substrate, and a vapor deposition film in a pattern corresponding to each mask opening 71R is formed as the red island-shaped hole transport layer 42R on the film formed substrate. In the red island-shaped hole transport layer forming step (S31), the layered body after the common hole transport layer forming step (S21) is used as the film formed substrate, as illustrated in FIG. 10.

The size of the film thickness securing region 42aR and the size of the shadow region 42bR can be changed by, for example, the thickness of the vapor deposition mask 70R, the taper angle of the mask openings 71R, and the size of the gap between the vapor deposition mask 70R and the film formed substrate. Thus, the size of the mask opening 71R is not particularly limited, but when the pitch between adjacent pixels 2 is set to be from 45 μm to 50 μm, it is preferable for the mask opening 71R to be formed larger in size by 12 μm to 18 μm than a side of the peripheral portion of the red pixel light-emitting region RA (to rephrase, the opening 35a to serve as the red pixel light-emitting region RA) while taking the peripheral portion of the red pixel light-emitting region RA as the reference, for example. In other words, the mask opening 71R is preferably formed such that the distance d1 between the peripheral portion of the red pixel light-emitting region RA and the opening end face of the vapor deposition mask 70R (edge portion of the mask opening 71R) illustrated in FIG. 10 is set to be from 12 μm to 18 μm.

The taper angle of the mask opening 71R is generally equal to or less than 60 degrees, and preferably equal to or less than 45 degrees. The vapor deposition mask 70R may be a metal mask made of Invar steel, which is an iron-nickel alloy, or the like, may be a resin mask made of resin such as polyimide, or may be a conjugate mask having a metal layer and a resin layer.

Figure 11:
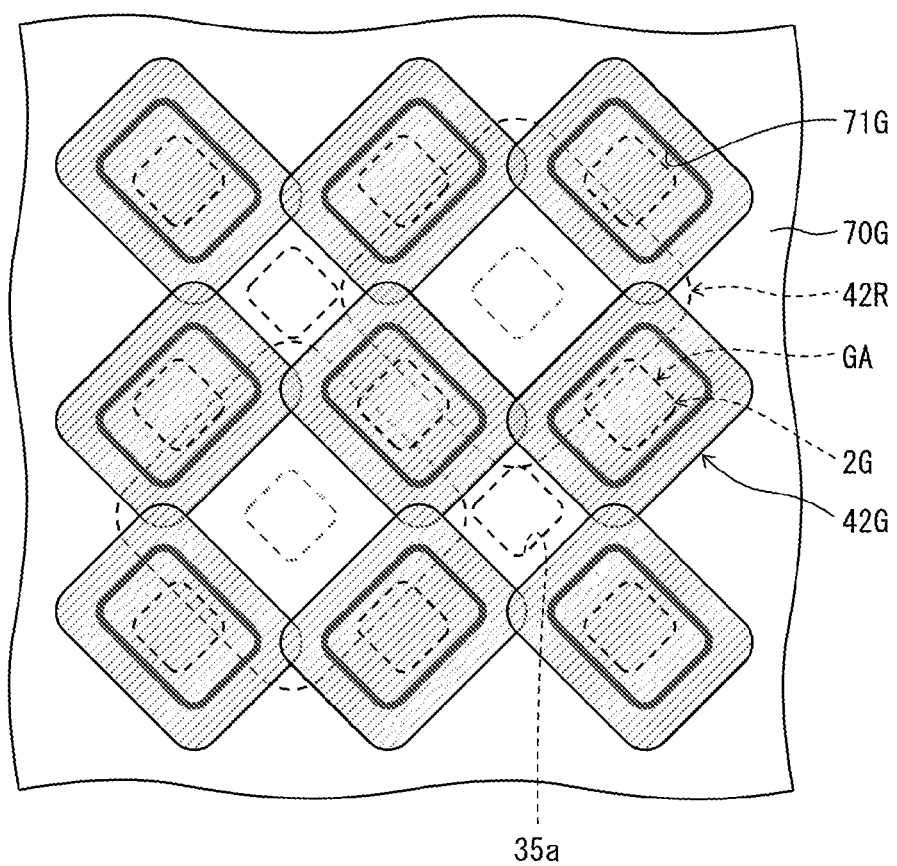
FIG. 11 is a plan view illustrating a relationship between a mask opening of a vapor deposition mask used for forming a green island-shaped hole transport layer, and a green island-shaped hole transport layer and a green pixel light-emitting region, according to an embodiment of the disclosure.
Figure 12:
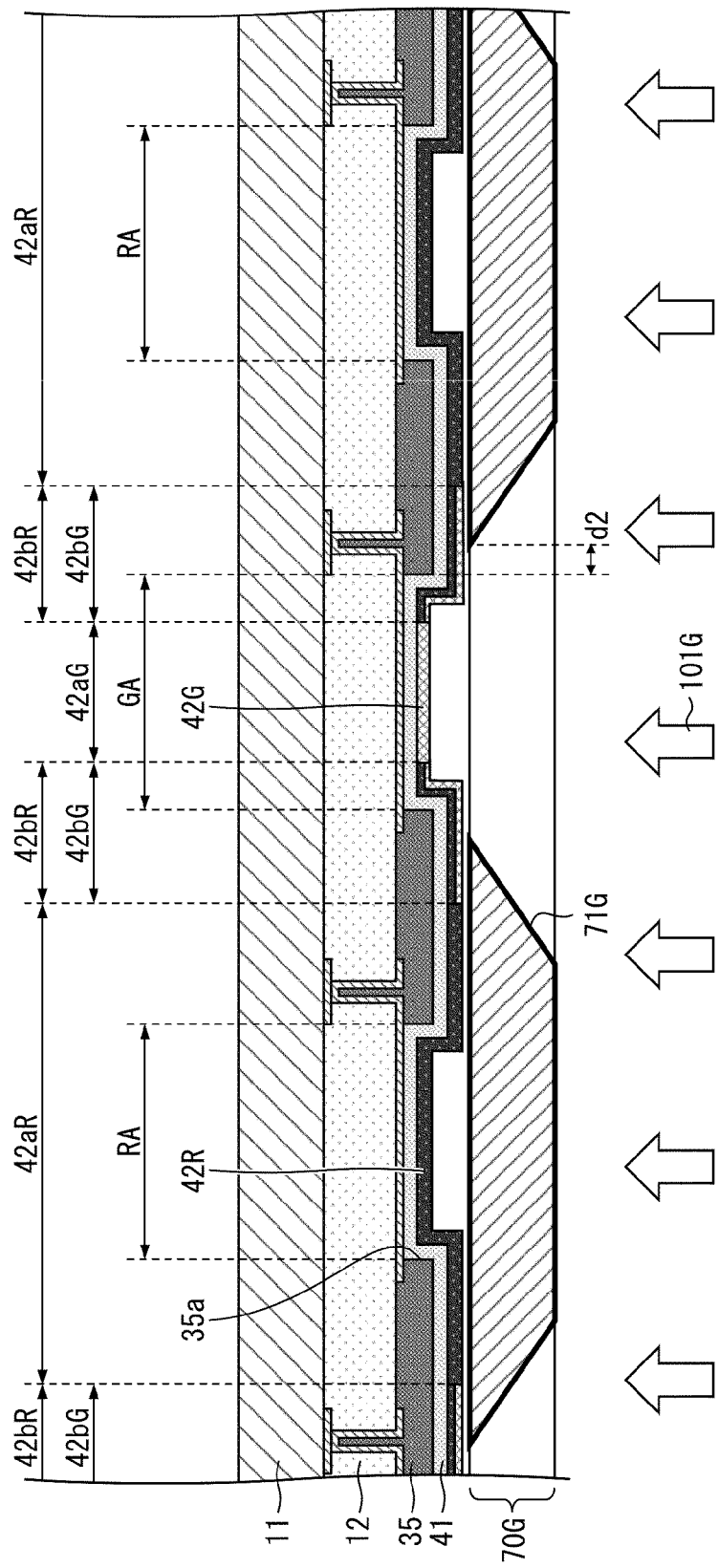
FIG. 12 is a cross-sectional view illustrating a step of forming a green island-shaped hole transport layer in a display device according to an embodiment of the disclosure.

FIG. 11 is a plan view illustrating a relationship between the mask opening 71G of the vapor deposition mask 70G used for forming the green island-shaped hole transport layer 42G, and the green island-shaped hole transport layer 42G and the green pixel light-emitting region GA. FIG. 12 is a cross-sectional view illustrating a step of forming the green island-shaped hole transport layer 42G in the display device 1 (S32). Note that, also in FIG. 11, for convenience of illustration, part of the pixel arrangement is omitted.

In the green island-shaped hole transport layer forming step (S32), separately patterning vapor deposition is performed by using the vapor deposition mask 70G, as the FMM, provided with the mask opening 71G for each green pixel 2G corresponding to the green island-shaped hole transport layer 42G, as illustrated in FIGS. 11 and 12.

In the present embodiment, in order that part of the shadow region 42bR of the red island-shaped hole transport layer 42R overlaps with part of the shadow region 42bG of the green island-shaped hole transport layer 42G at a portion within the green pixel light-emitting region GA, used is a vapor deposition mask, as the vapor deposition mask 70G, in which the distance d2 between the opening end face of the vapor deposition mask 70G (the end face of the mask opening 71G) and the circumferential end portion of the green pixel light-emitting region GA in the direction in which the red pixel 2R and the green pixel 2G are adjacent to each other, as illustrated in FIGS. 11 and 12, is shorter than the distance d4 between the opening end face of the vapor deposition mask 80G used for forming the green light-emitting layer 43G, to be explained later, and the circumferential end portion of the green pixel light-emitting region GA in the direction described above.

As illustrated in FIG. 12 the mask opening 71G functions as a passage that allows a green island-shaped hole transport material to pass through as vapor deposition particles 101G during vapor deposition. The vapor deposition mask 70G has the same configuration as the vapor deposition mask 70R except that, in place of the mask opening 71R, the mask opening 71G including an opening pattern corresponding to the green island-shaped hole transport layer 42G is provided as described above. In the green island-shaped hole transport layer forming step (S32), the layered body after the red island-shaped hole transport layer forming step (S31), in which the red island-shaped hole transport layer 42R has been formed, is used as the film formed substrate, as illustrated in FIGS. 11 and 12.

Similarly to the red island-shaped hole transport layer 42R, the size of the film thickness securing region 42aG and the size of the shadow region 42bG of the green island-shaped hole transport layer 42G can be changed by, for example, the thickness of the vapor deposition mask 70G, the taper angle of the mask openings 71G, and the size of the gap between the vapor deposition mask 70G and the film formed substrate. Thus, the size of the mask opening 71G is not particularly limited, but when the pitch between adjacent pixels 2 is set to be from 45 μm to 50 μm, it is preferable for the mask opening 71G to be formed larger in size by 4 μm to 8 μm in a direction sandwiched by the red pixels 2R than a side of the peripheral portion of the green pixel light-emitting region GA (to rephrase, the opening 35a to serve as the green pixel light-emitting region GA) while taking the peripheral portion of the green pixel light-emitting region GA in the direction described above as the reference, for example. In other words, the mask opening 71G is preferably formed such that the distance d2 between the green pixel light-emitting region GA and the opening end face of the vapor deposition mask 70G (edge portion of the mask opening 71G) illustrated in FIG. 12 is set to be from 4 μm to 8 μm. As in the mask opening 71R, the taper angle of the mask opening 71G is generally equal to or less than 60 degrees, and preferably equal to or less than 45 degrees.

As discussed above, it is desirable that the end portion of the film thickness securing region 42aG of the green island-shaped hole transport layer 42G be coincident with the end portion of the shadow region 42bR of the red island-shaped hole transport layer 42R, in the green pixel light-emitting region GA. The positioning between the end portion of the film thickness securing region 42aG and the end portion of the shadow region 42bR may be carried out by, for example, adjusting the taper angles of the mask openings 71G and 71R.

In the blue island-shaped hole transport layer forming step (S33), separately patterning vapor deposition is performed by using a vapor deposition mask (not illustrated) (hereinafter, referred to as a "vapor deposition mask 70B"), as the FMM, provided with a mask opening for each blue pixel 2B (hereinafter, referred to as a "mask opening 71B") corresponding to the blue island-shaped hole transport layer 42B.

As discussed above, the shadow region 42bR of the red island-shaped hole transport layer 42R is not formed within the blue pixel light-emitting region BA in the PenTile arrangement. Thus, in the blue island-shaped hole transport layer forming step (S33), as the vapor deposition mask 70B, a vapor deposition mask having the same mask opening pattern as the vapor deposition mask for forming the blue light-emitting layer 43B may be used, for example.

However, as discussed above, in the case where the display device 1 includes pixel arrangement called a stripe array, for example, in order that part of the shadow region 42bR of the red island-shaped hole transport layer 42R overlaps with part of the shadow region 42bB of the blue island-shaped hole transport layer 42B at a portion within the blue pixel light-emitting region BA, a vapor deposition mask may be used, as the vapor deposition mask 70B, in which a distance between the opening end face of the vapor deposition mask 70B (the end face of the mask opening 71B) and the circumferential end portion of the blue pixel light-emitting region BA in a direction in which the red pixel 2R and the blue pixel 2B are adjacent to each other is shorter than a distance between an opening end face (an end face of a mask opening (hereinafter, referred to as a "mask opening 81B")) of a vapor deposition mask used for forming the blue light-emitting layer 43B (hereinafter, referred to as a "vapor deposition mask 80B") and the circumferential end portion of the blue pixel light-emitting region BA in the direction in which the red pixel 2R and the blue pixel 2B are adjacent to each other. In this case, for example, used is a vapor deposition mask that includes a mask opening 71B having an area smaller than that of the blue pixel light-emitting region BA (strictly speaking, the opening 35a to serve as the blue pixel light-emitting region BA in the present process) surrounded by the bank 35, and also smaller than that of the mask opening 81B of the vapor deposition mask 80B.

Figure 13:
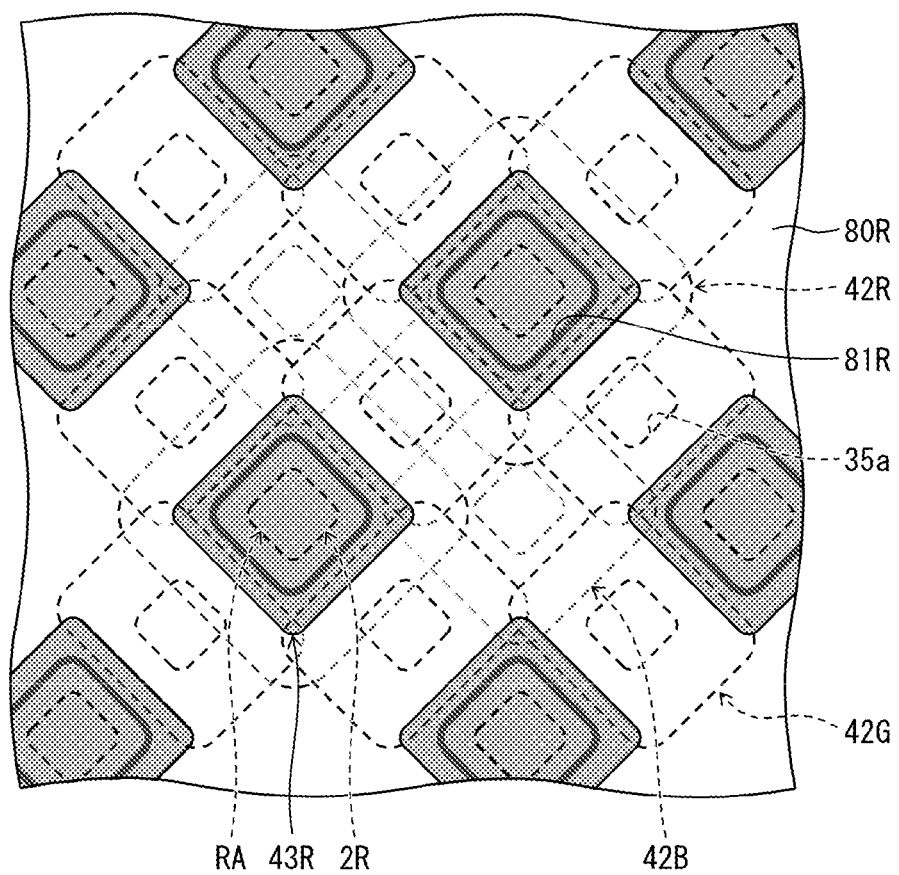
FIG. 13 is a plan view illustrating a relationship between a mask opening of a vapor deposition mask used for forming a red light-emitting layer, and a red island-shaped hole transport layer and a red pixel light-emitting region, according to an embodiment of the disclosure.
Figure 14:
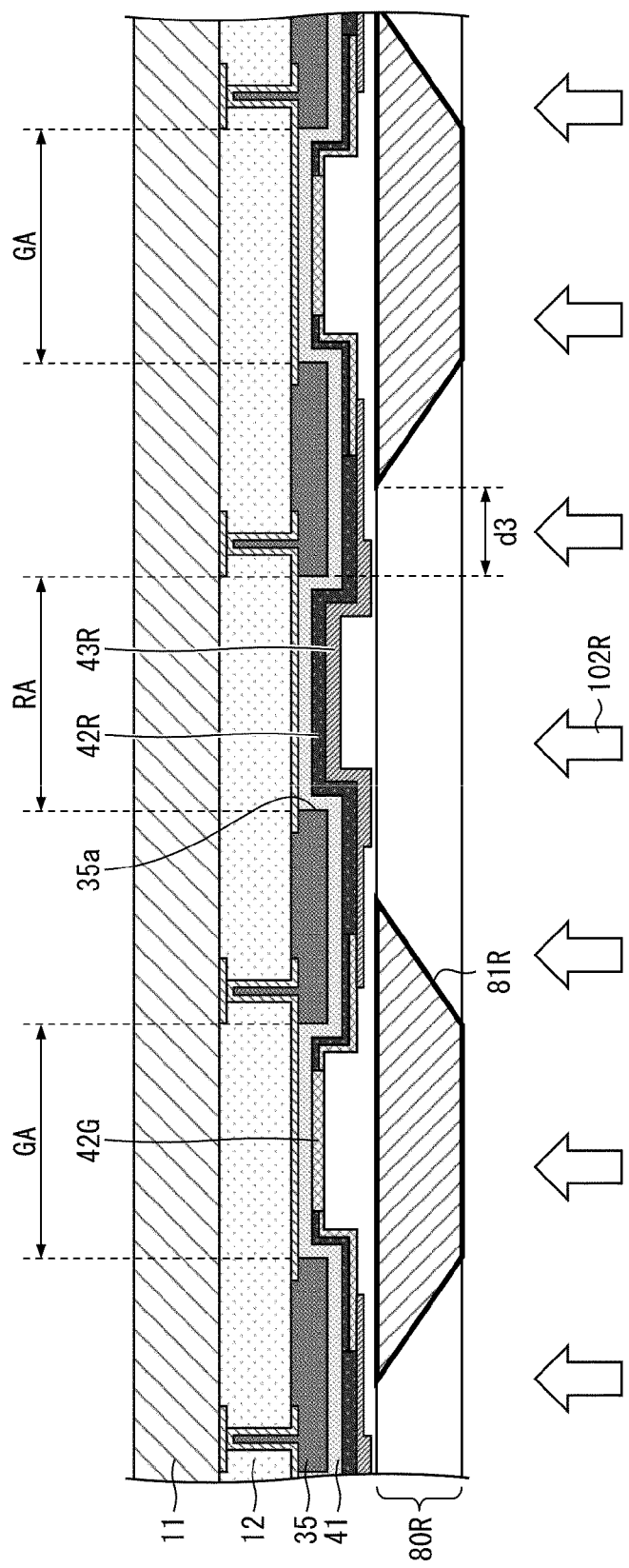
FIG. 14 is a cross-sectional view illustrating a step of forming a red light-emitting layer in a display device according to an embodiment of the disclosure.

FIG. 13 is a plan view illustrating a relationship between the mask opening 81R of the vapor deposition mask 80R used for forming the red light-emitting layer 43R, and the red island-shaped hole transport layer 42R and the red pixel light-emitting region RA. FIG. 14 is a cross-sectional view illustrating the step of forming the red light-emitting layer 43R in the display device 1 (S41). Note that, also in FIG. 13, for convenience of illustration, part of the pixel arrangement is omitted.

In the red light-emitting layer forming step (S41), separately patterning vapor deposition is performed by using the vapor deposition mask 80R, as the FMM, provided with the mask opening 81R for each red pixel 2R corresponding to the red light-emitting layer 43R, as illustrated in FIGS. 13 and 14.

As illustrated in FIGS. 13 and 14, as the vapor deposition mask 80R, used is a vapor deposition mask that includes the mask opening 81R (opening) having an area larger than that of the red pixel light-emitting region RA (strictly speaking, the opening 35a to serve as the red pixel light-emitting region RA in the present process) surrounded by the bank 35, and smaller than that of the mask opening 71R of the vapor deposition mask 70R as discussed above.

As illustrated in FIG. 14, the mask opening 81R functions as a passage that allows a red luminescent material to pass through as vapor deposition particles 102R during vapor deposition. The vapor deposition mask 80R has the same configuration as the vapor deposition mask 70R except that, in place of the mask opening 71R, the mask opening 81R smaller in size than the mask opening 71R is provided. In the red light-emitting layer forming step (S41), the layered body after the island-shaped hole transport layer forming step (S22), in which the red island-shaped hole transport layer 42R and the green island-shaped hole transport layer 42G have been formed, is used as the film formed substrate, as illustrated in FIG. 14.

The size of the mask opening 81R is not particularly limited, but when the pitch between adjacent pixels 2 is set to be from 45 μm to 50 μm, it is preferable for the mask opening 81R to be formed larger in size by 8 μm to 12 μm than a side of the peripheral portion of the red pixel light-emitting region RA (to rephrase, the opening 35a to serve as the red pixel light-emitting region RA) while taking the peripheral portion of the red pixel light-emitting region RA as the reference, for example. In other words, the mask opening 81R is preferably formed such that the distance d3 between the red pixel light-emitting region RA and the opening end face of the vapor deposition mask 80R (edge portion of the mask opening 81R) illustrated in FIG. 14 is set to be from 8 μm to 12 μm. As in the mask opening 71R, the taper angle of the mask opening 81R is generally equal to or less than 60 degrees, and preferably equal to or less than 45 degrees.

Figure 15:
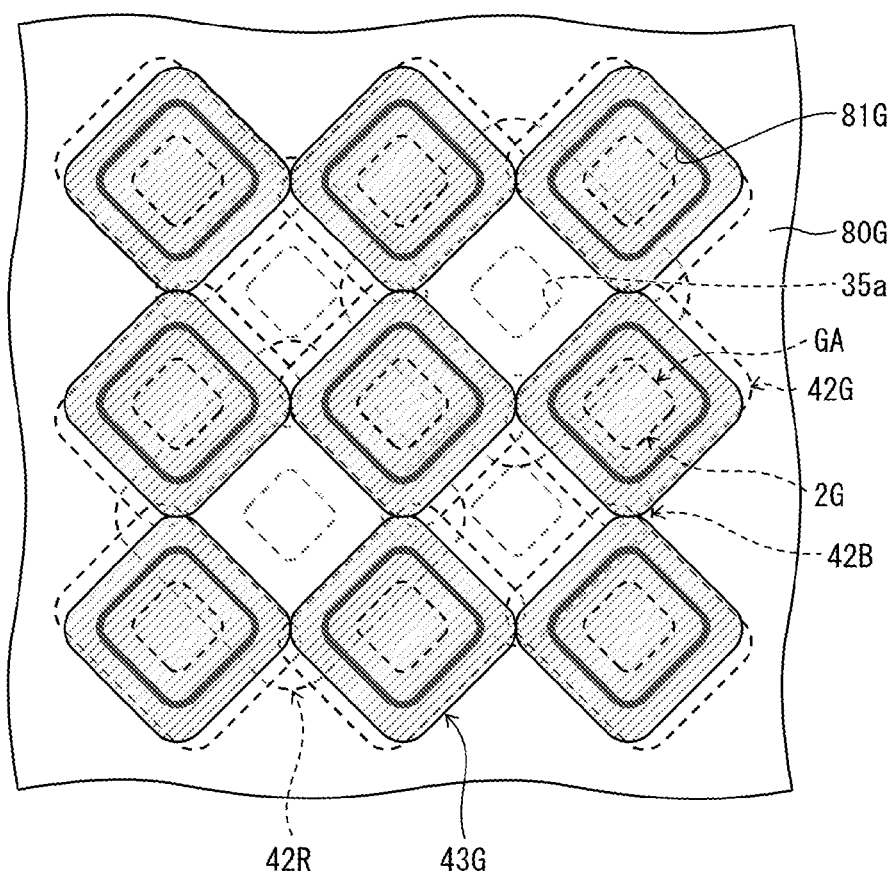
FIG. 15 is a plan view illustrating a relationship between a mask opening of a vapor deposition mask used for forming a green light-emitting layer, and a green island-shaped hole transport layer and a green pixel light-emitting region, according to an embodiment of the disclosure.
Figure 16:
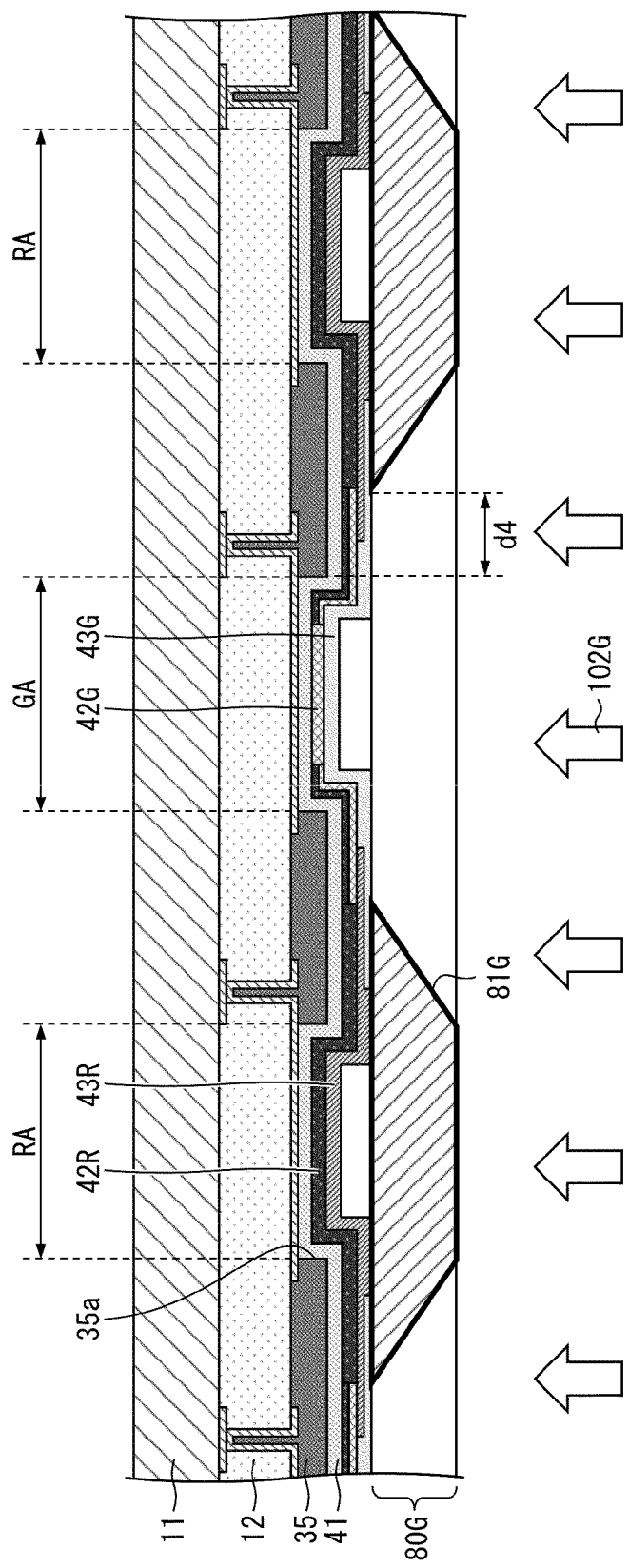
FIG. 16 is a cross-sectional view illustrating a step of forming a green light-emitting layer in a display device according to an embodiment of the disclosure.

FIG. 15 is a plan view illustrating a relationship between the mask opening 81G of the vapor deposition mask 80G used for forming the green light-emitting layer 43G, and the green island-shaped hole transport layer 42G and the green pixel light-emitting region GA. FIG. 16 is a cross-sectional view illustrating the step of forming the green light-emitting layer 43G in the display device 1 (S42). Note that, also in FIG. 16, for convenience of illustration, part of the pixel arrangement is omitted.

In the green light-emitting layer forming step (S42), separately patterning vapor deposition is performed by using the vapor deposition mask 80G, as the FMM, provided with the mask opening 81G for each green pixel 2G corresponding to the green light-emitting layer 43G, as illustrated in FIGS. 15 and 16.

As illustrated in FIGS. 15 and 16, as the vapor deposition mask 80G, used is a vapor deposition mask which includes the mask opening 81G (opening) having an area larger than that of the green pixel light-emitting region GA (strictly speaking, the opening 35a to serve as the green pixel light-emitting region GA in the present process) surrounded by the bank 35, and in which, as discussed above, the distance d4 between the end face of the mask opening 81G and the circumferential end portion of the green pixel light-emitting region GA in the direction in which the red pixel 2R and the green pixel 2G are adjacent to each other is larger than the distance d2 between the opening end face of the vapor deposition mask 70G and the circumferential end portion of the green pixel light-emitting region GA in the direction described above.

As illustrated in FIG. 16, the mask opening 81G functions as a passage that allows a green luminescent material to pass through as vapor deposition particles 102G during vapor deposition. The vapor deposition mask 80G has the same configuration as the vapor deposition mask 70G except that, in place of the mask opening 71G, the mask opening 81G having the above-described configuration is provided. In the green light-emitting layer forming step (S42), the layered body after the red light-emitting layer forming step (S41) is used as the film formed substrate, as illustrated in FIG. 16.

The mask opening 81G is formed in the same size as the mask opening 81R. The size of the mask opening 81G is not particularly limited, but when the pitch between adjacent pixels 2 is set to be from 45 μm to 50 μm, it is preferable for the mask opening 81G to be formed larger in size by 8 μm to 12 μm than a side of the peripheral portion of the green pixel light-emitting region GA (to rephrase, the opening 35a to serve as the green pixel light-emitting region GA) while taking the peripheral portion of the green pixel light-emitting region GA as the reference, for example. In other words, the mask opening 81G is preferably formed such that the distance d4 (d3=d4) between the green pixel light-emitting region GA and the opening end face of the vapor deposition mask 80G (edge portion of the mask opening 81G) illustrated in FIG. 16 is set to be from 8 μm to 12 μm (where d2<d4). As in the mask opening 71G, the taper angle of the mask opening 81G is generally equal to or less than 60 degrees, and preferably equal to or less than 45 degrees.

In the present embodiment, in the red island-shaped hole transport layer forming step (S31) and the green island-shaped hole transport layer forming step (S32), the vapor deposition masks 70R and 70G are used in which the respective mask openings 71R and 71G are designed in such a manner that an end portion of the film thickness securing region 42aG of the green island-shaped hole transport layer 42G is coincident with an end portion of the shadow region 42bR of the red island-shaped hole transport layer 42R within the green pixel light-emitting region GA. Further, in the present embodiment, in the island-shaped hole transport layer forming step (S22) and the light-emitting layer forming step (S23), separately patterning vapor deposition of the island-shaped hole transport layer 42 and the light-emitting layer 43 in each light-emitting element 31 is performed in such a manner as to cause the distance between the reflective layer and the semipermeable reflective layer (for example, the distance between the first electrode and the second electrode 34) in each light-emitting element 31 to be an optical path length (resonator length) in which the peak wavelength of color light emitted from each pixel 2 resonates. At this time, in the present embodiment, in the red island-shaped hole transport layer forming step (S31), the green island-shaped hole transport layer forming step (S32), the red light-emitting layer forming step (S41), and the green light-emitting layer forming step (S42), it is preferable to design the respective mask openings 71R and 71G of the vapor deposition masks 70R and 70G and to set the film thicknesses of the red island-shaped hole transport layer 42R, the green island-shaped hole transport layer 42G, the red light-emitting layer 43R, and the green light-emitting layer 43G in such a manner that the distance between the reflective layer and the semipermeable reflective layer at the portion where the shadow region 42bR of the red island-shaped hole transport layer 42R overlaps with the shadow region 42bG of the green island-shaped hole transport layer 42G is set to be an optical path length in which the peak wavelength of the green light resonates.

Advantageous Effects

Effects of the display device 1 and the manufacturing method for the display device 1 according to the present embodiment will be described below with reference to comparative examples and examples. For the sake of convenience of description, constituent elements having the same functions in the display device 1 illustrated in FIGS. 1 to 3 are denoted by the same reference signs, and description thereof will be omitted.

Figure 17:
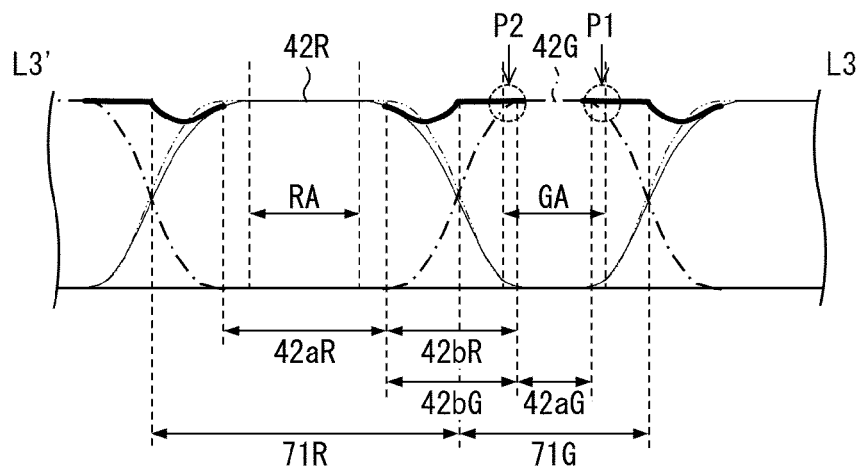
FIG. 17 is a descriptive diagram illustrating a relationship among a size of an initial mask opening of a vapor deposition mask for film formation of a red island-shaped hole transport layer in a display device according to an embodiment of the disclosure, a size of an initial mask opening of a vapor deposition mask for film formation of a green island-shaped hole transport layer in the display device according to the embodiment of the disclosure, a change in film thickness distribution of a red island-shaped hole transport layer and a green island-shaped hole transport layer when the red island-shaped hole transport layer and the green island-shaped hole transport layer are continuously film-formed by using these vapor deposition masks, and a red pixel light-emitting region and a green pixel light-emitting region.

FIG. 17 is a descriptive diagram illustrating, as an example, a relationship among the size of the initial mask opening 71R of the vapor deposition mask 70R for film formation of the red island-shaped hole transport layer 42R in the display device 1 according to the present embodiment, the size of the initial mask opening 71G of the vapor deposition mask 70G for film formation of the green island-shaped hole transport layer 42G in the display device 1 according to the present embodiment, a change in film thickness distribution of the red island-shaped hole transport layer 42R and the green island-shaped hole transport layer 42G when the red island-shaped hole transport layer 42R and the green island-shaped hole transport layer 42G are continuously film-formed by using the vapor deposition masks 70R and 70G, and the red pixel light-emitting region RA and the green pixel light-emitting region GA.

Figure 18:
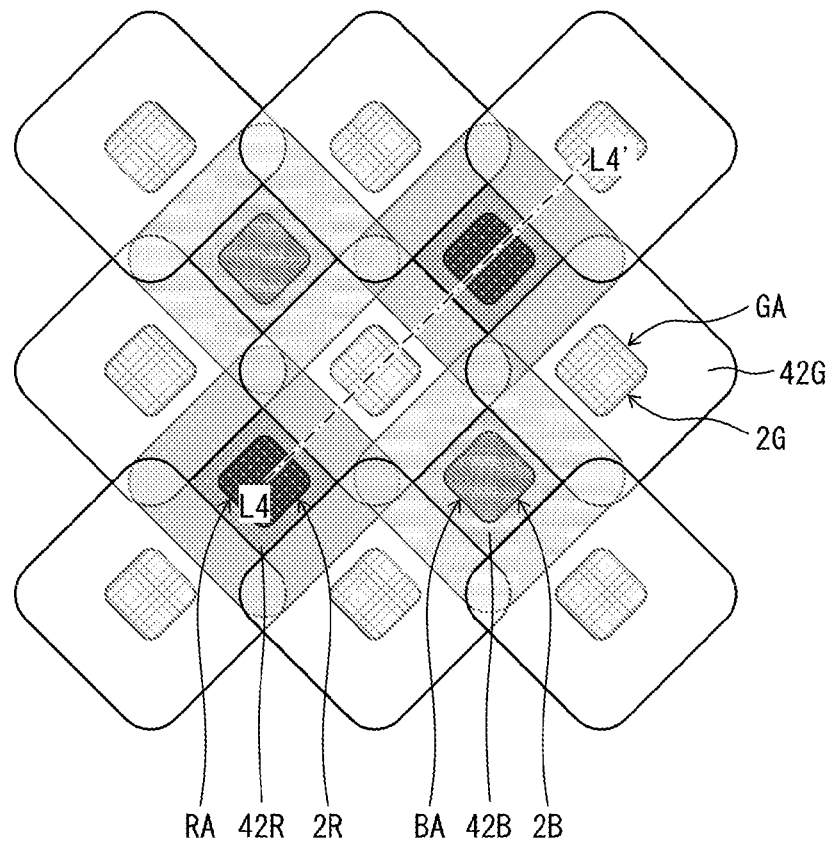
FIG. 18 is a plan view illustrating a schematic configuration of main portions of a display device according to Comparative Example 1.
Figure 19:
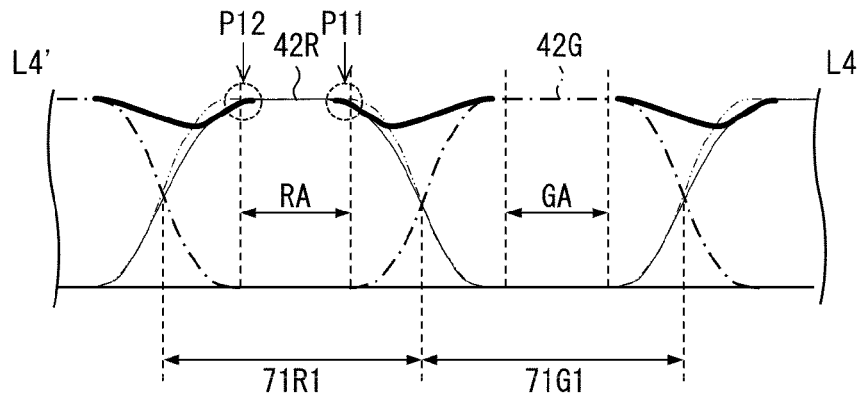
FIG. 19 is a descriptive diagram illustrating a relationship among a size of an initial mask opening of a vapor deposition mask for film formation of a red island-shaped hole transport layer in the display device according to Comparative Example 1, a size of an initial mask opening of a vapor deposition mask for film formation of a green island-shaped hole transport layer in the display device according to Comparative Example 1, a change in film thickness distribution of a red island-shaped hole transport layer and a green island-shaped hole transport layer when the red island-shaped hole transport layer and the green island-shaped hole transport layer are continuously film-formed by using these vapor deposition masks, and a red pixel light-emitting region and a green pixel light-emitting region.

FIG. 18 is a plan view illustrating a schematic configuration of main portions of a display device 1 according to Comparative Example 1, which will be explained later. FIG. 19 is a descriptive diagram illustrating a relationship among the size of an initial mask opening 71R1 of a vapor deposition mask (hereinafter referred to as a "vapor deposition mask 70R1") for film formation of a red island-shaped hole transport layer 42R in the display device 1 according to Comparative Example 1, which will be explained later, the size of an initial mask opening 71G1 of a vapor deposition mask (hereinafter referred to as a "vapor deposition mask 70G1") for film formation of a green island-shaped hole transport layer 42G in the display device 1 according to Comparative Example 1, which will be explained later, a change in film thickness distribution of the red island-shaped hole transport layer 42R and the green island-shaped hole transport layer 42G when the red island-shaped hole transport layer 42R and the green island-shaped hole transport layer 42G are continuously film-formed by using the vapor deposition masks 70R1 and 70G1, and a red pixel light-emitting region RA and a green pixel light-emitting region GA.

Figure 20:
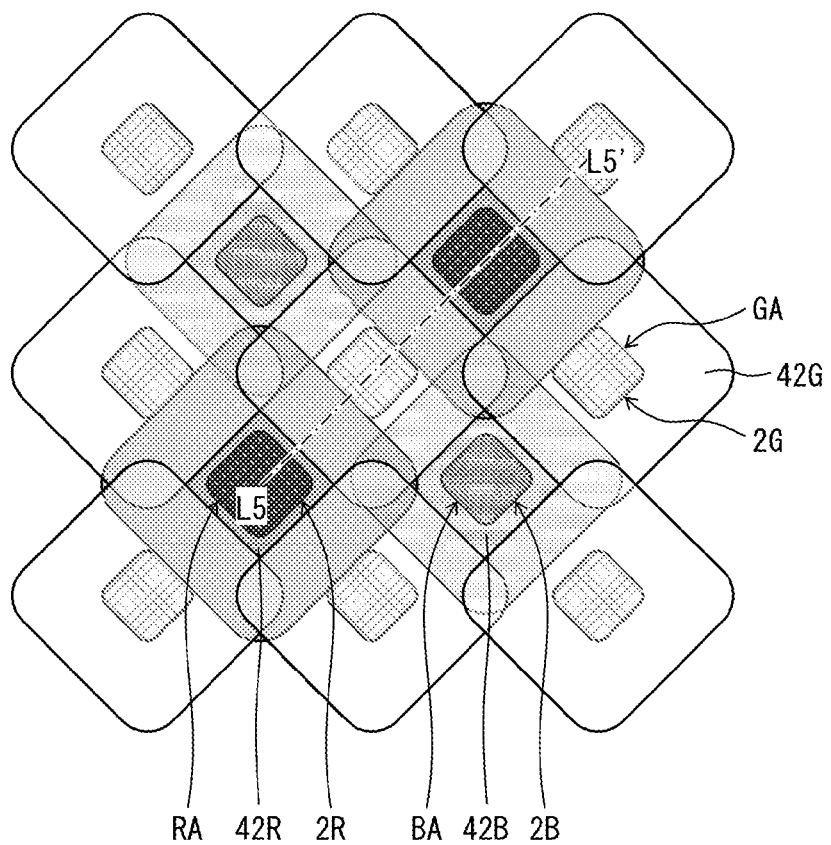
FIG. 20 is a plan view illustrating a schematic configuration of main portions of a display device according to Comparative Example 2.
Figure 21:
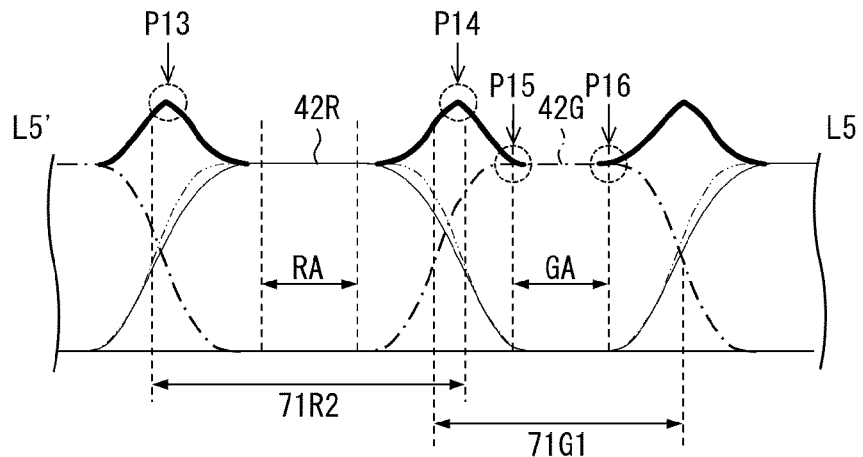
FIG. 21 is a descriptive diagram illustrating a relationship among a size of an initial mask opening of a vapor deposition mask for film formation of a red island-shaped hole transport layer in a display device according to Comparative Example 2, a size of an initial mask opening of a vapor deposition mask for film formation of a green island-shaped hole transport layer in the display device according to Comparative Example 2, a change in film thickness distribution of a red island-shaped hole transport layer and a green island-shaped hole transport layer when the red island-shaped hole transport layer and the green island-shaped hole transport layer are continuously film-formed by using these vapor deposition masks, and a red pixel light-emitting region and a green pixel light-emitting region.

FIG. 20 is a plan view illustrating a schematic configuration of main portions of a display device 1 according to Comparative Example 2. FIG. 21 is a descriptive diagram illustrating a relationship among the size of an initial mask opening 71R2 of a vapor deposition mask (hereinafter referred to as a "vapor deposition mask 70R2") for film formation of a red island-shaped hole transport layer 42R in the display device 1 according to Comparative Example 2, which will be explained later, the size of an initial mask opening 71G2 of a vapor deposition mask (hereinafter referred to as a "vapor deposition mask 70G2") for film formation of a green island-shaped hole transport layer 42G in the display device 1 according to Comparative Example 2, which will be explained later, a change in film thickness distribution of the red island-shaped hole transport layer 42R and the green island-shaped hole transport layer 42G when the red island-shaped hole transport layer 42R and the green island-shaped hole transport layer 42G are continuously film-formed by using the vapor deposition masks 70R2 and 70G2, and a red pixel light-emitting region RA and a green pixel light-emitting region GA.

Figure 22:
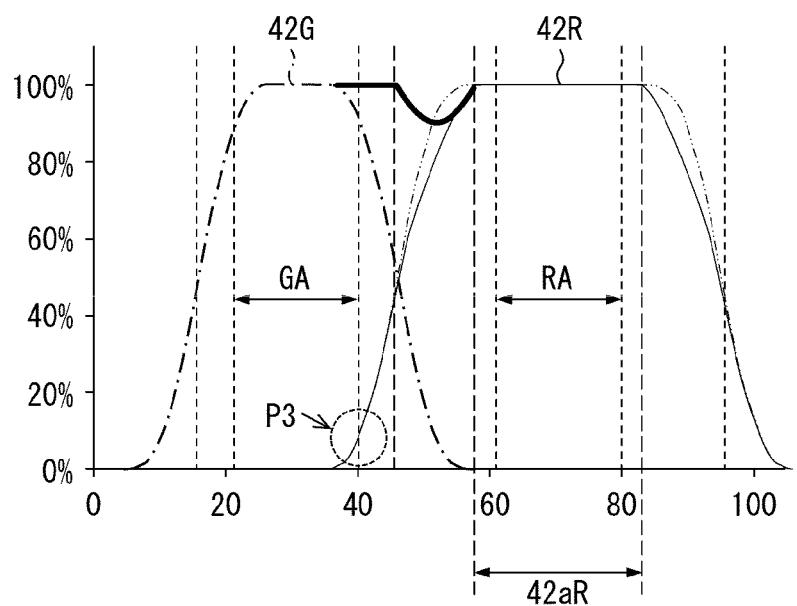
FIG. 22 is a diagram describing a film thickness of a red island-shaped hole transport layer at a peripheral portion of a green pixel in a display device according to an embodiment of the disclosure.

FIG. 22 is a diagram describing a film thickness of the red island-shaped hole transport layer 42R at a peripheral portion of the green pixel 2G in the display device 1 according to the present embodiment.

Note that in FIG. 18 and FIG. 20, for the sake of convenience of illustration, the numbers of red pixels 2R, green pixels 2G, and blue pixels 2B are respectively lessened. For the sake of convenience of illustration, FIGS. 18 and 20 illustrate only the red island-shaped hole transport layer 42R and the red pixel light-emitting region RA in the red pixel 2R, the green island-shaped hole transport layer 42G and the green pixel light-emitting region GA in the green pixel 2G, and the blue island-shaped hole transport layer 42B and the blue pixel light-emitting region BA in the blue pixel 2B.

FIG. 19 illustrates film thickness distribution of the red island-shaped hole transport layer 42R and the green island-shaped hole transport layer 42G in a cross section taken along a line L4-L4' indicated in FIG. 18. FIG. 21 illustrates film thickness distribution of the red island-shaped hole transport layer 42R and the green island-shaped hole transport layer 42G in a cross section taken along a line L5-L5' indicated in FIG. 20.

In FIGS. 17, 19, 21, and 22, the film thickness distribution of the red island-shaped hole transport layer 42R indicates film thickness distribution (relative film thickness) when a desired film thickness of the red island-shaped hole transport layer 42R in the red pixel light-emitting region RA (in other words, the film thickness of the film thickness securing region 42aR) in each display device 1 is taken as 100%, and the film thickness distribution of the green island-shaped hole transport layer 42G indicates film thickness distribution when the film thickness of the green island-shaped hole transport layer 42G in the green pixel light-emitting region GA (in other words, the film thickness of the film thickness securing region 42aG) in each display device 1 is taken as 100%.

In FIGS. 17, 19, 21, and 22, thin solid lines each indicate film thickness distribution in a single layer of the red island-shaped hole transport layer 42R at the first film formation of the red island-shaped hole transport layer 42R by using a vapor deposition mask for forming the red island-shaped hole transport layer (the vapor deposition mask 70R in FIG. 17, vapor deposition mask 70R1 in FIG. 19, and vapor deposition mask 70R2 in FIG. 21), and double-dot dash lines each indicate initial film thickness distribution of the red island-shaped hole transport layer 42R after a change in film thickness distribution by the continuous film formation described above. Dot-dash lines each indicate film thickness distribution in a single layer of the green island-shaped hole transport layer 42G. Thick solid lines in a region between the red pixel light-emitting region RA and the green pixel light-emitting region GA each indicate film thickness distribution of the island-shaped hole transport layer 42 in a state in which the green island-shaped hole transport layer 42G is layered on the red island-shaped hole transport layer 42R after the continuous film formation described above.

COMPARATIVE EXAMPLE 1

As illustrated in FIG. 18, in the display device 1 according to the present comparative example, effective pixels (the red pixel light-emitting region RA, green pixel light-emitting region GA, and blue pixel light-emitting region BA) are respectively designed such that the island-shaped hole transport layers 42 have the same size, and each of the island-shaped hole transport layers 42 does not overlap with the adjacent pixels 2. For this reason, an opening dimension of each of the mask openings 71R1 and 71G1 illustrated in FIG. 19 is designed in such a manner that each of the island-shaped hole transport layer 42 does not overlap with the adjacent pixels 2.

As described above, since the peak wavelength of the red light emitted from the red pixel 2R is longer than the peak wavelength of the green light emitted from the green pixel 2G, the thickness of the red island-shaped hole transport layer 42R is set to be thicker than the thickness of the green island-shaped hole transport layer 42G. With this, even in the case where the vapor deposition masks 70R1 and 70G1 are used the same number of times, a larger amount of hole transport material adheres to the surface of the vapor deposition mask 70R1 than to the surface of the vapor deposition mask 70G1 by the continuous film formation.

As a result, as indicated by the dot-dash line in FIG. 19, before a noticeable change in film thickness distribution of the green island-shaped hole transport layer 42G is observed, in the red island-shaped hole transport layer 42R, a region where the film thickness gradually decreases (the shadow region 42bR) is expanded, and film thickness uniformity of the island-shaped hole transport layer 42 in the red pixel light-emitting region RA decreases, as denoted by P11 and P12.

COMPARATIVE EXAMPLE 2

In the display device 1 according to the present comparative example, similarly to the red island-shaped hole transport layer 42R of the display device 1 according to the present embodiment, in response to a difference in washing cycle between the vapor deposition mask 70R2 and the vapor deposition mask 70G2 due to a difference in film thickness between the red island-shaped hole transport layer 42R and the green island-shaped hole transport layer 42G, the film formation region of the red island-shaped hole transport layer 42R was more expanded, as illustrated in FIG. 20, than that in Comparative Example 1 illustrated in FIG. 18. Specifically, in the display device 1 according to the present comparative example, similarly to the display device 1 according to the present embodiment, the red island-shaped hole transport layer 42R was formed such that the area of the red island-shaped hole transport layer 42R is larger than the area of the green island-shaped hole transport layer 42G and also larger than the area of the red light-emitting layer 43R, and part of the shadow region 42bR in the red island-shaped hole transport layer 42R is located at a portion within the green pixel light-emitting region GA of the green pixel 2G adjacent to the red pixel 2R provided with the red island-shaped hole transport layer 42R. However, unlike the display device 1 according to the present embodiment, in the display device 1 according to the present comparative example, the film formation region of the green island-shaped hole transport layer 42G was not reduced, as illustrated in FIG. 20.

Also in this case, as indicated by the dot-dash line in FIG. 21, before a noticeable change in film thickness distribution of the green island-shaped hole transport layer 42G is observed, a region where the film thickness gradually decreases (the shadow region 42bR) is expanded in the red island-shaped hole transport layer 42R. However, in the present comparative example, as described above, since the film formation region of the red island-shaped hole transport layer 42R is expanded, the film thickness distribution within the red pixel light-emitting region RA does not change even when the continuous film formation is performed the same number of times as in Comparative Example 1 illustrated in FIG. 19, thereby making it possible to improve the film thickness uniformity of the island-shaped hole transport layer 42 in the red pixel light-emitting region RA.

On the other hand, in the present comparative example, as denoted by P13 and P14 in FIG. 21, the film thickness of the island-shaped hole transport layer 42 at a portion where the red island-shaped hole transport layer 42R overlaps with the green island-shaped hole transport layer 42G is thicker than that in Comparative Example 1 illustrated in FIG. 19.

In the non light-emitting region between the red pixel light-emitting region RA and the green pixel light-emitting region GA, there arises no problem even when the film thickness distribution of the island-shaped hole transport layer 42 is in disarray, as denoted by P13 and P14 in FIG. 21. However, in the present comparative example, in the case where part of the red island-shaped hole transport layer 42R enters (mixes) into the green pixel light-emitting region GA of the green pixel 2G adjacent to the red pixel 2R provided with the red island-shaped hole transport layer 42R, the film thickness uniformity of the island-shaped hole transport layer 42 in the green pixel light-emitting region GA is lowered, as denoted by P15 and P16 in FIG. 21.

EXAMPLE

In the present example, as described in the present embodiment, the film formation region of the red island-shaped hole transport layer 42R was more expanded than that in Comparative Example 1 illustrated in FIG. 18 and the film formation region of the green island-shaped hole transport layer 42G was reduce such that the red island-shaped hole transport layer 42R has an area larger than that of the green island-shaped hole transport layer 42G and also larger than that of the red light-emitting layer 43R, and part of the shadow region 42bR in the red island-shaped hole transport layer 42R overlaps with part of the shadow region 42bG in the green island-shaped hole transport layer 42G at a portion within the green pixel light-emitting region GA.

Therefore, according to the present example, similarly to Comparative Example 2, even when the continuous film formation is performed the same number of times as in Comparative Example 1 illustrated in FIG. 19, there occurs no change in the film thickness distribution within the red pixel light-emitting region RA as denoted by P1 and P2 in FIG. 17, so that the film thickness uniformity of the island-shaped hole transport layer 42 in the red pixel light-emitting region RA may be improved.

On the other hand, in the present example, as described above, since part of the shadow region 42bR in the red island-shaped hole transport layer 42R and part of the shadow region 42bG in the green island-shaped hole transport layer 42G overlap with each other at a portion within the green pixel light-emitting region GA, the total film thickness of both the shadow regions 42bR and 42bG at the portion where the shadow region 42bR and the shadow region 42bG overlap with each other in the green pixel light-emitting region GA may be made equal to the film thickness of the film thickness securing region 42aG in the green island-shaped hole transport layer 42G. As a result, the film thickness uniformity of the island-shaped hole transport layer 42 in the green pixel light-emitting region GA may be improved.

In the non light-emitting region between the red pixel light-emitting region RA and the green pixel light-emitting region GA, when the red hole transport material adheres to the surface of the vapor deposition mask 70R due to the continuous film formation, the area of the film thickness securing region 43aR is reduced in proportion to a reduction in size of the mask opening 71R, thereby expanding the shadow region 42bR. Therefore, also in the present example, in the non light-emitting region between the red pixel light-emitting region RA and the green pixel light-emitting region GA, although there occurs slight disarray in the film thickness distribution of the island-shaped hole transport layer 42, there arises no problem even in the case where such disarray occurs in the film thickness distribution of the island-shaped hole transport layer 42, because the above disarray occurs in the non light-emitting region.

In addition, according to the present example, as described in the present embodiment, the shadow regions 42bR and 42bG are used for the overlapping of the red island-shaped hole transport layer 42R and the green island-shaped hole transport layer 42G in the green pixel light-emitting region GA. Accordingly, also with the continuous film formation during the production, an overlapping region between the red island-shaped hole transport layer 42R and the green island-shaped hole transport layer 42G may be maintained. Thus, the overlapping of the shadow regions 42bR and 42bG makes it possible to maintain the resonator length within the green pixel light-emitting region GA. In the green pixel light-emitting region GA, the distance between the reflective layer and the semipermeable reflective layer at the portion where the shadow region 42bR of the red island-shaped hole transport layer 42R overlaps with the shadow region 42bG of the green island-shaped hole transport layer 42G is equal to an optical path length in which the peak wavelength of the green light resonates.

According to the present example, as described in the present embodiment, there is no need to overlap part of the shadow region 42bR and part of the shadow region 42bG only on the bank 35 between the red pixel light-emitting region RA and the green pixel light-emitting region GA. This makes it possible to shorten the pitch between adjacent pixels 2. Therefore, according to the present example, the area of the red island-shaped hole transport layer 42R can be increased without increasing the size of the display device 1.

In the separately patterning vapor deposition in which a vapor deposition film is formed for each luminescent color by using a vapor deposition mask, the pitch of the FMM becomes finer as the display device 1 becomes higher in definition. However, in the present embodiment, since part of the shadow region 42bR and part of the shadow region 42bG overlap each other at a portion within the green pixel light-emitting region GA as discussed above, it is possible to obtain high resolution even when there is not sufficient room for the pitch between adjacent pixels 2.

In the present embodiment, it is preferable that the red island-shaped hole transport layer 42R be formed such that the film thickness of the red island-shaped hole transport layer 42R at the peripheral portion of the green pixel 2G comes to be 5 to 10% of the film thickness of the red island-shaped hole transport layer 42R in the red pixel light-emitting region RA (a relative film thickness when the film thickness of the film thickness securing region 42aR [[)]] is taken as 100%), as denoted by P3 in FIG. 22.

As described above, according to the present embodiment, the mask openings 71R of the vapor deposition mask 70R used to form the red island-shaped hole transport layer 42R can be expanded beyond the known mask opening, and the washing cycle of the vapor deposition mask 70R can be extended as compared to that of the known art, while maintaining the light emission characteristics of the display device 1. Therefore, according to the present embodiment, it is possible to provide the high-resolution display device 1 and the manufacturing method for the stated display device 1, which are able to improve the productivity as compared to the known art.

MODIFIED EXAMPLE

In the above embodiment, a case in which one picture element 3 is constituted by three color pixels 2 of red (R), green (G), and blue (B) is exemplified and explained. However, the present embodiment is not limited thereto. The one picture element 3 may be constituted by a plurality of pixels 2 other than R, G, and B, such as cyan (C), magenta (M), and yellow (Y) having different peak wavelengths.

In any case, when light having the longest peak wavelength is defined as first light, the pixel 2 configured to emit the first light is defined as a first pixel, the island-shaped hole transport layer 42 provided corresponding to the first pixel is defined as a first island-shaped hole transport layer, the island-shaped hole transport layer 42 provided being adjacent to the first pixel and corresponding to a second pixel configured to emit second light whose peak wavelength is shorter than that of the first light is defined as a second island-shaped hole transport layer, it is sufficient that the first island-shaped hole transport layer and the second island-shaped hole transport layer have the above-described relationship.

Supplement

A display device 1 according to a first aspect of the disclosure is a display device provided with a plurality of pixels 2 including a first pixel (for example, the red pixel 2R) configured to emit first light with a peak wavelength being the longest wavelength, and a second pixel (for example, the green pixel 2G) being adjacent to the first pixel and configured to emit second light with a peak wavelength being a shorter wavelength than the first light, the display device 1 including: a common hole transport layer 41 in a solid-like state provided to be shared by each pixel 2; island-shaped hole transport layers 42 layered adjacent to the common hole transport layer 41 and provided in an island shape for each of the plurality of pixels 2; light-emitting layers 43 layered adjacent to each of the island-shaped hole transport layers 42 and provided in an island shape for each of the plurality of pixels 2; and a pixel separation wall (bank 35) disposed between adjacent pixels 2. In the display device 1, an opening (opening 35a) of the pixel separation wall is a light-emitting region of each pixel; each of the island-shaped hole transport layers 42 includes a film thickness securing region (for example, the film thickness securing region 42aR, 42aG) having a constant film thickness, and a shadow region (for example, the shadow region 42bR, 42bG) provided on a peripheral portion of the film thickness securing region and having a film thickness that is gradually thinned; a film thickness securing region of a first island-shaped hole transport layer (for example, the film thickness securing region 42aR of the red island-shaped hole transport layer 42R), among the island-shaped hole transport layers 42, provided corresponding to the first pixel is provided across the light-emitting region of the first pixel (for example, the red pixel light-emitting region RA) in a direction in which the first pixel and the second pixel are adjacent to each other; a film thickness securing region of a second island-shaped hole transport layer (for example, the film thickness securing region 42aG of the green island-shaped hole transport layer 42G), among the island-shaped hole transport layers 42, provided corresponding to the second pixel is located inside the light-emitting region of the second pixel (for example, the green pixel light-emitting region GA) in the direction described above; and part of a shadow region (for example, the shadow region 42bR) of the first island-shaped hole transport layer and part of a shadow region (for example, the shadow region 42bG) of the second island-shaped hole transport layer overlap with each other inside the light-emitting region of the second pixel (for example, the green pixel light-emitting region GA).

The display device 1 according to the second aspect of the disclosure is such that, in the first aspect, at a portion where the shadow region of the first island-shaped hole transport layer overlaps with the shadow region of the second island-shaped hole transport layer, the total film thickness of both the shadow regions may be equal to a film thickness of the above film thickness securing region (for example, the film thickness securing region 43aG) in the second island-shaped hole transport layer, at least in the light-emitting region of the second pixel.

The display device 1 according to a third aspect of the disclosure is such that, in the first or second aspect, the film thickness of the film thickness securing region (for example, the film thickness securing region 42aR) in the first island-shaped hole transport layer may be thicker than film thicknesses of island-shaped hole transport layers other than the first island-shaped hole transport layer (for example, the green island-shaped hole transport layer 42G and the blue island-shaped hole transport layer 42B).

The display device 1 according to a fourth aspect of the disclosure is such that, in any one of the first to third aspects, an end portion of the film thickness securing region (for example, the film thickness securing region 43aG) of the second island-shaped hole transport layer may coincide with an end portion of the shadow region (for example, the shadow region 42bR) of the first island-shaped hole transport layer in the second pixel light-emitting region.

The display device 1 according to a fifth aspect of the disclosure further includes, in any one of the first to fourth aspects, a function layer 33 including the common hole transport layer 41, the island-shaped hole transport layer 42, and the light-emitting layer 43 between an anode electrode (for example, the first electrode 32) and a cathode electrode (for example, the second electrode 34). The common hole transport layer 41, the island-shaped hole transport layer 42, and the light-emitting layer 43 are layered in that order from the anode electrode side between the anode electrode and the cathode electrode. One of the anode electrode and the cathode electrode includes a reflective layer, and the other one of them includes a semipermeable reflective layer. The distance between the reflective layer and the semipermeable reflective layer takes an optical path length in which a peak wavelength of color light emitted from each pixel 2 resonates. In the light-emitting region of the second pixel, the distance between the reflective layer and the semipermeable reflective layer at a portion where the shadow region of the first island-shaped hole transport layer overlaps with the shadow region of the second island-shaped hole transport layer may be equal to an optical path length in which a peak wavelength of the second light resonates.

The display device 1 according to a sixth aspect of the disclosure is such that, in any one of the first to fifth aspects, the first island-shaped hole transport layer and the second island-shaped hole transport layer may be layered in that order from the common hole transport layer 41 side at a portion where the shadow region of the first island-shaped hole transport layer overlaps with the shadow region of the second island-shaped hole transport layer.

The display device 1 according to a seventh aspect of the disclosure is such that, in any one of the first to sixth aspects, the HOMO level of the island-shaped hole transport layer 42 in each pixel 2 may be equal to the HOMO level of the common hole transport layer 41 or shallower than the HOMO level of the common hole transport layer 41, and may be deeper than the HOMO level of the light-emitting layer 43, which is layered in an adjacent manner.

The display device 1 according to an eighth aspect of the disclosure is such that, in any one of the first to seventh aspects, the LUMO level of the island-shaped hole transport layer 42 in each pixel 2 may be equal to the LUMO level of the common hole transport layer 41 or deeper than the LUMO level of the common hole transport layer 41, and may be shallower than the LUMO level of the light-emitting layer 43, which is layered in an adjacent manner.

The display device 1 according to a ninth aspect of the disclosure is such that, in any one of the first to eighth aspects, the common hole transport layer 41 and the first island-shaped hole transport layer may be formed of an identical material.

The display device 1 according to a tenth aspect of the disclosure is such that, in the ninth aspect, the first island-shaped hole transport layer may be layered on the common hole transport layer 41 at a portion where the common hole transport layer 41 and the first island-shaped hole transport layer overlap each other.

The display device 1 according to an eleventh aspect of the disclosure is such that, in any one of the first to tenth aspects, the film thickness of the film thickness securing region in the first island-shaped hole transport layer may be thicker than the film thickness of the second island-shaped hole transport layer.

The display device 1 according to a twelfth aspect of the disclosure is such that, in the eleventh aspect, the first island-shaped hole transport layer may be an island-shaped hole transport layer in a red pixel configured to emit red light, and the second island-shaped hole transport layer may be an island-shaped hole transport layer in a green pixel configured to emit green light.

The display device 1 according to a thirteenth aspect of the disclosure is such that, in the twelfth aspect, the plurality of pixels may include blue pixels configured to emit blue light, and the second island-shaped hole transport layer in the green pixel may have a rectangular shape in which, in a plan view, the length in a direction sandwiched by the red pixels is shorter while the length in a direction sandwiched by the blue pixels is longer.

The display device 1 according to a fourteenth aspect of the disclosure is such that, in any one of the first to thirteenth aspects, the first light may be red light.

The display device 1 according to a fifteenth aspect of the disclosure is such that, in the fourteen aspect, the second light may be green light.

A manufacturing method for a display device 1 according to a sixteenth aspect of the disclosure is a manufacturing method for a display device provided with a plurality of pixels 2 including a first pixel (for example, the red pixel 2R) configured to emit first light with a peak wavelength being the longest wavelength, and a second pixel (for example, the green pixel 2G) being adjacent to the first pixel and configured to emit second light with a peak wavelength being a shorter wavelength than the first light, the method including: (1) forming a pixel separation wall (bank 35) between adjacent pixels 2; and (2) forming a function layer in which included are forming a common hole transport layer 41 in a solid-like state provided to be shared by each pixel, forming island-shaped hole transport layers layered adjacent to the common hole transport layer 41 and provided in an island shape for each of the plurality of pixels, and forming light-emitting layers layered adjacent to each island-shaped hole transport layer and provided in an island shape for each of the plurality of pixels. Further, an opening (opening 35a) of the pixel separation wall is a light-emitting region of each pixel. In the forming of the island-shaped hole transport layers, film thickness securing regions having a constant film thickness (for example, the film thickness securing regions 42aR and 42aG) and shadow regions (for example, the shadow regions 42bR and 42bG) each provided on a peripheral portion of the film thickness securing region and having a film thickness that is gradually thinned are formed in the island-shaped hole transport layers; and a first island-shaped hole transport layer and a second island-shaped hole transport layer are formed in such a manner that a film thickness securing region of the first island-shaped hole transport layer (for example, the film thickness securing region 42aR of the red island-shaped hole transport layer 42R), among the island-shaped hole transport layers 42, provided corresponding to the first pixel is provided across the light-emitting region of the first pixel (for example, the red pixel light-emitting region RA) in a direction in which the first pixel and the second pixel are adjacent to each other, a film thickness securing region of the second island-shaped hole transport layer (for example, the film thickness securing region 42aG of the green island-shaped hole transport layer 42G), among the island-shaped hole transport layers 42, provided corresponding to the second pixel is located inside the light-emitting region of the second pixel (for example, the green pixel light-emitting region GA) in the direction described above, and part of a shadow region (for example, the shadow region 42bR) of the first island-shaped hole transport layer and part of a shadow region (for example, the shadow region 42bG) of the second island-shaped hole transport layer (for example, the green light-emitting layer 43G) overlap each other at a portion within the light-emitting region of the second pixel (for example, the green pixel light-emitting region GA).

The manufacturing method for the display device 1 according to a seventeenth aspect of the disclosure is such that, in the sixteenth aspect, in each of the forming of the island-shaped hole transport layers and the forming of the light-emitting layers, vacuum vapor deposition may be performed by using a vapor deposition mask having a plurality of openings (for example, the vapor deposition mask 70R having the plurality of mask openings 71R, the vapor deposition mask 70G having the plurality of mask openings 71G, the vapor deposition mask 80R having the plurality of mask openings 81R, or the vapor deposition mask 80G having the plurality of mask openings 81G), and in the forming of the island-shaped hole transport layers, the second island-shaped hole transport layer may be formed by using a vapor deposition mask to serve as the vapor deposition mask for forming the second island-shaped hole transport layer (for example, the vapor deposition mask 70G) in which a first distance (for example, the distance d2) between an opening end face of the vapor deposition mask and a circumferential end portion of the second pixel light-emitting region in the direction described above is shorter than a second distance (for example, the distance d4), in the direction described above, between an opening end face of a vapor deposition mask (for example, the vapor deposition mask 80G) for forming a second light-emitting layer, among the light-emitting layers, corresponding to the second pixel, and a circumferential end portion of the second pixel light-emitting region, and the first island-shaped hole transport layer may be formed by using a vapor deposition mask to serve as the vapor deposition mask for forming the first island-shaped hole transport layer (for example, the vapor deposition mask 70R) in which a third distance (for example, the distance d1) between an opening end face of the vapor deposition mask and a circumferential end portion of the first pixel light-emitting region in the direction described above is longer than a fourth distance (for example, the distance d3), in the direction described above, between an opening end face of a vapor deposition mask (for example, the vapor deposition mask 80R) for forming a first light-emitting layer, among the light-emitting layers, corresponding to the first pixel, and a circumferential end portion of the first pixel light-emitting region, and also longer than the second distance.

The manufacturing method for the display device 1 according to an eighteenth aspect of the disclosure is such that, in the sixteenth or seventeenth aspect, the manufacturing method further includes forming an anode electrode (for example, the first electrode 32) and forming a cathode electrode (for example, the second electrode 34); the forming of the anode electrode, the forming of the common hole transport layer, the forming of the island-shaped hole transport layers, the forming of the light-emitting layers, and the forming of the cathode electrode may be carried out in that order; in the forming of the anode electrode and the forming of the cathode electrode, the anode electrode and the cathode electrode may be formed in such a manner that one of the anode electrode and the cathode electrode includes a reflective layer and the other one of them includes a semipermeable reflective layer; and in the forming of the function layer, the function layer may be formed in such a manner that a distance between the reflective layer and the semipermeable reflective layer takes an optical path length in which a peak wavelength of color light emitted from each pixel 2 resonates.

The manufacturing method for the display device 1 according to a nineteenth aspect of the disclosure is such that, in any one of the sixteenth to eighteenth aspects, after the forming of the first island-shaped hole transport layer, the forming of the second island-shape hole transport layer may be carried out.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A display device provided with a plurality of pixels including a first pixel configured to emit first light with a peak wavelength being a longest wavelength, and a second pixel being adjacent to the first pixel and configured to emit second light with a peak wavelength being a shorter wavelength than the first light, the display device comprising:
   a common hole transport layer in a solid-like state provided to be shared by each pixel;
   island-shaped hole transport layers layered adjacent to the common hole transport layer and provided in an island shape for each of the plurality of pixels;
   light-emitting layers layered adjacent to each of the island-shaped hole transport layers and provided in an island shape for each of the plurality of pixels; and
   a pixel separation wall disposed between adjacent pixels,
   wherein an opening of the pixel separation wall is a light-emitting region of each pixel,
   each of the island-shaped hole transport layers includes a film thickness securing region having a constant film thickness, and a shadow region provided on a peripheral portion of the film thickness securing region and having a film thickness that is gradually thinned,
   a film thickness securing region of a first island-shaped hole transport layer, among the island-shaped hole transport layers, provided corresponding to the first pixel is provided across the light-emitting region of the first pixel in a direction in which the first pixel and the second pixel are adjacent to each other,
   a film thickness securing region of a second island-shaped hole transport layer, among the island-shaped hole transport layers, provided corresponding to the second pixel is located inside the light-emitting region of the second pixel in the direction described above, and
   part of a shadow region of the first island-shaped hole transport layer and part of a shadow region of the second island-shaped hole transport layer overlap with each other inside the light-emitting region of the second pixel.

2. The display device according to claim 1, wherein at a portion where the shadow region of the first island-shaped hole transport layer overlaps with the shadow region of the second island-shaped hole transport layer, a total film thickness of both the shadow regions is equal to a film thickness of the film thickness securing region in the second island-shaped hole transport layer, at least in the light-emitting region of the second pixel.

3. The display device according to claim 1, wherein the film thickness of the film thickness securing region in the first island-shaped hole transport layer is thicker than film thicknesses of island-shaped hole transport layers other than the first island-shaped hole transport layer.

4. The display device according to claim 1, wherein an end portion of the film thickness securing region of the second island-shaped hole transport layer coincides with an end portion of the shadow region of the first island-shaped hole transport layer in the second pixel light-emitting region.

5. The display device according to claim 1, further comprising:
   a function layer including the common hole transport layer, the island-shaped hole transport layer, and the light-emitting layer between an anode electrode and a cathode electrode,
   wherein the common hole transport layer, the island-shaped hole transport layer, and the light-emitting layer are layered in that order from the anode electrode side between the anode electrode and the cathode electrode, one of the anode electrode and the cathode electrode includes a reflective layer, and the other one of the anode electrode and the cathode electrode includes a semipermeable reflective layer, a distance between the reflective layer and the semipermeable reflective layer takes an optical path length in which a peak wavelength of color light emitted from each pixel resonates, and in the light-emitting region of the second pixel, the distance between the reflective layer and the semipermeable reflective layer at a portion where the shadow region of the first island-shaped hole transport layer overlaps with the shadow region of the second island-shaped hole transport layer is equal to an optical path length in which a peak wavelength of the second light resonates.

6. The display device according to claim 1, wherein the first island-shaped hole transport layer and the second island-shaped hob transport layer are layered in that order from the common hole transport layer side at a portion where the shadow region of the first island-shaped hole transport layer overlaps with the shadow region of the second island-shaped hole transport layer.

7. The display device according to claim 1, wherein a HOMO level of the island-shaped hole transport layer in each pixel is equal to a HOMO level of the common hole transport layer or shallower than the HOMO level of the common hole transport layer, and is deeper than a HOMO level of the light-emitting layer, which is layered in an adjacent manner.

8. The display device according to claim 1, wherein a LUMO level of the island-shaped hole transport layer in each pixel is equal to a LUMO level of the common hole transport layer or deeper than the LUMO level of the common hole transport layer, and is shallower than a LUMO level of the light-emitting layer, which is layered in an adjacent manner.

9. The display device according to claim 1, wherein the common hole transport layer and the first island-shaped hole transport layer are formed of an identical material.

10. The display device according to claim 9, wherein the first island-shaped hole transport layer is layered on the common hole transport layer at a portion where the common hole transport layer and the first island-shaped hole transport layer overlap each other.

11. The display device according to claim 1, wherein the film thickness of the film thickness securing region in the first island-shaped hole transport layer is thicker than the film thickness of the second island-shaped hole transport layer.

12. The display device according to claim 11, wherein the first island-shaped hole transport layer is an island-shaped hole transport layer in a red pixel configured to emit red light, and the second island-shaped hole transport layer is an island-shaped hole transport layer in a green pixel configured to emit green light.

13. The display device according to claim 12, wherein the plurality of pixels include blue pixels configured to emit blue light, and the second island-shaped hole transport layer in the green pixel has a rectangular shape in which, in a plan view, a length in a direction sandwiched by the red pixels is shorter while a length in a direction sandwiched by the blue pixels is longer.

14. The display device according to claim 1, wherein the first light is red light.

15. The display device according to claim 14, wherein the second light is green light.

16. A manufacturing method for a display device provided with a plurality of pixels including a first pixel configured to emit first light with a peak wavelength being a longest wavelength, and a second pixel being adjacent to the first pixel and configured to emit second light with a peak wavelength being a shorter wavelength than the first light, the method comprising:

forming a pixel separation wall between adjacent pixels; and forming a function layer in which included are forming a common hole transport layer in a solid-like state provided to be shared by each pixel, forming island-shaped hole transport layers layered adjacent to the common hole transport layer and provided in an island shape for each of the plurality of pixels, and forming light-emitting layers layered adjacent to each island-shaped hole transport layer and provided in an island shape for each of the plurality of pixels, wherein an opening of the pixel separation wall is a light-emitting region of each pixel, and in the forming of the island-shaped hole transport layers, film thickness securing regions having a constant film thickness and shadow regions each provided on a peripheral portion of the film thickness securing region and having a film thickness that is gradually thinned are formed in the island-shaped hole transport layers, and a first island-shaped hole transport layer and a second island-shaped hole transport layer are formed in such a manner that a film thickness securing region of the first island-shaped hole transport layer, among the island-shaped hole transport layers, provided corresponding to the first pixel is provided across the light-emitting region of the first pixel in a direction in which the first pixel and the second pixel are adjacent to each other, a film thickness securing region of the second island-shaped hole transport layer, among the island-shaped hole transport layers, provided corresponding to the second pixel is located inside the light-emitting region of the second pixel in the direction described above, and part of a shadow region of the first island-shaped hole transport layer and part of a shadow region of the second island-shaped hole transport layer overlap each other at a portion within the light-emitting region of the second pixel.

17. The manufacturing method for the display device according to claim 16, wherein in each of the forming of the island-shaped hole transport layers and the forming of the light-emitting layers, vacuum vapor deposition is performed by using a vapor deposition mask having a plurality of openings, and in the forming of the island-shaped hole transport layers, the second island-shaped hole transport layer is formed by using a vapor deposition mask to serve as the vapor deposition mask for forming the second island-shaped hole transport layer in which a first distance between an opening end face of the vapor deposition mask and a circumferential end portion of the second pixel light-emitting region in the direction described above is shorter than a second distance, in the direction described above, between an opening end face of a vapor deposition mask for forming a second light-emitting layer, among the light-emitting layers, corresponding to the second pixel, and a circumferential end portion of the second pixel light-emitting region, and the first island-shaped hole transport layer is formed by using a vapor deposition mask to serve as the vapor deposition mask for forming the first island-shaped hole transport layer in which a third distance between an opening end face of the vapor deposition mask and a circumferential end portion of the first pixel light-emitting region in the direction described above is longer than a fourth distance, in the direction described above, between an opening end face of a vapor deposition mask for forming a first light-emitting layer, among the light-emitting layers, corresponding to the first pixel, and a circumferential end portion of the first pixel light-emitting region, and also longer than the second distance.

18. The manufacturing method for the display device according to claim 16, the method further comprising:

forming an anode electrode; and forming a cathode electrode, wherein the forming of the anode electrode, the forming of the common hole transport layer, the forming of the island-shaped hole transport layers, the forming of the light-emitting layers, and the forming of the cathode electrode are carried out in that order, in the forming of the anode electrode and the forming of the cathode electrode, the anode electrode and the cathode electrode are formed in such a manner that one of the anode electrode and the cathode electrode includes a reflective layer and the other one of the anode electrode and the cathode electrode includes a semipermeable reflective layer, and in the forming of the function layer, the function layer is formed in such a manner that a distance between the reflective layer and the semipermeable reflective layer takes an optical path length in which a peak wavelength of color light emitted from each pixel resonates.

19. The manufacturing method for the display device according to claim 16, wherein, after the forming of the first island-shaped hole transport layer, the forming of the second island-shaped hole transport layer is carried out.

* * * * *